United States Patent
Kataoka

(10) Patent No.: US 12,100,470 B2
(45) Date of Patent: Sep. 24, 2024

(54) SEMICONDUCTOR MEMORY DEVICE

(71) Applicant: KIOXIA CORPORATION, Tokyo (JP)

(72) Inventor: Hideyuki Kataoka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 90 days.

(21) Appl. No.: 17/897,074

(22) Filed: Aug. 26, 2022

(65) Prior Publication Data

US 2023/0307018 A1 Sep. 28, 2023

(30) Foreign Application Priority Data

Mar. 24, 2022 (JP) ................ 2022-047942

(51) Int. Cl.
  *G11C 7/10* (2006.01)
  *G11C 8/08* (2006.01)
(52) U.S. Cl.
  CPC .......... *G11C 7/1069* (2013.01); *G11C 7/1063* (2013.01); *G11C 8/08* (2013.01)
(58) Field of Classification Search
  CPC ....... G11C 7/1069; G11C 7/1063; G11C 8/08; G11C 16/30; G11C 11/5671; G11C 16/08; G11C 16/0483; G11C 11/5642; G11C 16/32; G11C 16/26; G11C 11/4091; G11C 7/18; G11C 8/10; G11C 8/14; G11C 11/4099
  USPC ...................................... 365/189.011, 189.05
  See application file for complete search history.

(56) References Cited

U.S. PATENT DOCUMENTS

| | | | |
|---|---|---|---|
| 6,977,845 B2 | 12/2005 | Kawai et al. | |
| 9,940,034 B2 | 4/2018 | Camp et al. | |
| 11,101,004 B1* | 8/2021 | Lee .................. | G11C 16/0483 |
| 2009/0251971 A1* | 10/2009 | Futatsuyama ........ | G11C 16/344 365/185.18 |
| 2010/0238733 A1* | 9/2010 | Fukuda ............... | G11C 11/5621 365/185.17 |
| 2012/0036310 A1 | 2/2012 | Nonaka et al. | |
| 2015/0003157 A1* | 1/2015 | Aritome ............ | G11C 16/3427 365/185.11 |
| 2017/0062065 A1* | 3/2017 | Shim .................... | G11C 29/028 |

(Continued)

FOREIGN PATENT DOCUMENTS

| | | |
|---|---|---|
| JP | 4156985 B2 | 9/2008 |
| JP | 2012-038385 A | 2/2012 |

(Continued)

*Primary Examiner* — Michael T Tran
(74) *Attorney, Agent, or Firm* — Kim & Stewart LLP

(57) ABSTRACT

A semiconductor storage device includes a memory string including memory transistors and a control circuit. The control circuit is configured to in response to a first command, perform a first read operation, and in response to a second command received during the first read operation, perform a second read operation. During the first read operation, a voltage of a first selected word line is decreased from a read pass voltage to a first read voltage and then increased to the read pass voltage. During the second read operation, a voltage of a second word line is set to a second read voltage and then increased to the read pass voltage. Voltages of word lines neither selected during the first nor second read operation are maintained between the first and second read operations.

20 Claims, 27 Drawing Sheets

(56) References Cited

U.S. PATENT DOCUMENTS

| | | |
|---|---|---|
| 2020/0020406 A1* | 1/2020 | Kim ................. G11C 16/08 |
| 2020/0219569 A1* | 7/2020 | Lee ................ G11C 11/5642 |
| 2020/0395075 A1* | 12/2020 | Joo .................... G11C 7/14 |
| 2021/0201982 A1* | 7/2021 | Choi ................ G11C 16/26 |
| 2021/0241837 A1* | 8/2021 | Date ............... G11C 11/5642 |
| 2021/0257039 A1* | 8/2021 | Prakash ........... G11C 16/3427 |
| 2021/0264989 A1* | 8/2021 | Yanagidaira ........ G11C 16/26 |
| 2021/0304837 A1* | 9/2021 | Kim ................. G11C 29/10 |
| 2021/0319838 A1* | 10/2021 | Joo ................. G11C 16/30 |
| 2021/0375367 A1* | 12/2021 | Senoo .............. G11C 16/24 |
| 2021/0375382 A1* | 12/2021 | Lim ................. G11C 16/26 |
| 2021/0398583 A1* | 12/2021 | An ................ G11C 16/0483 |
| 2022/0180942 A1* | 6/2022 | Ikegami ............ G11C 16/26 |
| 2022/0366966 A1 | 11/2022 | Kato |

FOREIGN PATENT DOCUMENTS

| | | |
|---|---|---|
| JP | 2022-174874 A | 11/2022 |
| JP | 2022-177691 A | 12/2022 |

\* cited by examiner

FIG. 23

|  | t401-t409 | t409-t418 | t418- |
|---|---|---|---|
| REGISTER OF OPERATION CURRENTLY BEING EXECUTED | $CS_{R1}(1)$ (LP) | $CS_{R1}(2)$ (MP) | $CS_{R1}(3)$ (UP) |

FIG. 25

| | t301–t305 | t305–t310 | t310–t311 | t311–t317 | t317–t318 | t318–t323 | t323– |
|---|---|---|---|---|---|---|---|
| REGISTER OF OPERATION CURRENTLY BEING EXECUTED | $CS_{R1}$ (LP) | $CS_{R1}$ (LP) | $CS_{R2}(1)$ (MP) | $CS_{R2}(1)$ (MP) | $CS_{R2}(2)$ (UP) | $CS_{R2}(2)$ (UP) | $CS_{R2}(3)$ (LP) |
| REGISTER OF OPERATION TO BE EXECUTED NEXT | | $CS_{R2}(1)$ (MP) | | $CS_{R2}(2)$ (UP) | | $CS_{R2}(3)$ (LP) | |

FIG. 27

| | t301–t305 | t305–t30X | t30X–t310 | t310–t311 | t311–t317 | t317–t318 | t318–t323 | t323– |
|---|---|---|---|---|---|---|---|---|
| REGISTER OF OPERATION CURRENTLY BEING EXECUTED | $CS_{R1}$ (LP) | $CS_{R1}$ (LP) | $CS_{R1}$ (LP) | $CS_{R2}(1)'$ (MP) | $CS_{R2}(1)'$ (MP) | $CS_{R2}(2)$ (UP) | $CS_{R2}(2)$ (UP) | $CS_{R2}(3)$ (LP) |
| REGISTER OF OPERATION TO BE EXECUTED NEXT | | $CS_{R2}(1)$ (MP) | $CS_{R2}(1)'$ (MP) | | $CS_{R2}(2)$ (UP) | | $CS_{R2}(3)$ (LP) | | ial
SEMICONDUCTOR MEMORY DEVICE

CROSS-REFERENCE TO RELATED APPLICATION

This application is based upon and claims the benefit of priority from Japanese Patent Application No. 2022-047942, filed Mar. 24, 2022, the entire contents of which are incorporated herein by reference.

FIELD

Embodiments described herein relate generally to a semiconductor memory device.

BACKGROUND

A semiconductor memory device including a memory string and a plurality of first wirings electrically connected to the memory string is known. In the semiconductor memory device, the memory string includes a plurality of memory transistors connected in series, and gate electrodes of the plurality of memory transistors are connected to the plurality of first wirings, respectively.

BRIEF DESCRIPTION OF THE DRAWINGS

FIG. 23 is a diagram showing an example of command data $D_{CMD}$ and address data $D_{ADD}$ stored in a command register CMR and an address register ADR during the read operation of the cache read.
FIG. 25 is a diagram showing an example of the command data $D_{CMD}$ and address data $D_{ADD}$ stored in the command register CMR and the address register ADR in the read operation of the connection read according to the first embodiment.
FIG. 27 is a diagram showing an example of the command data $D_{CMD}$ and address data $D_{ADD}$ stored in the command register CMR and the address register ADR schematically the read operation of the connection read according to the third embodiment.

DETAILED DESCRIPTION

Figure 1:
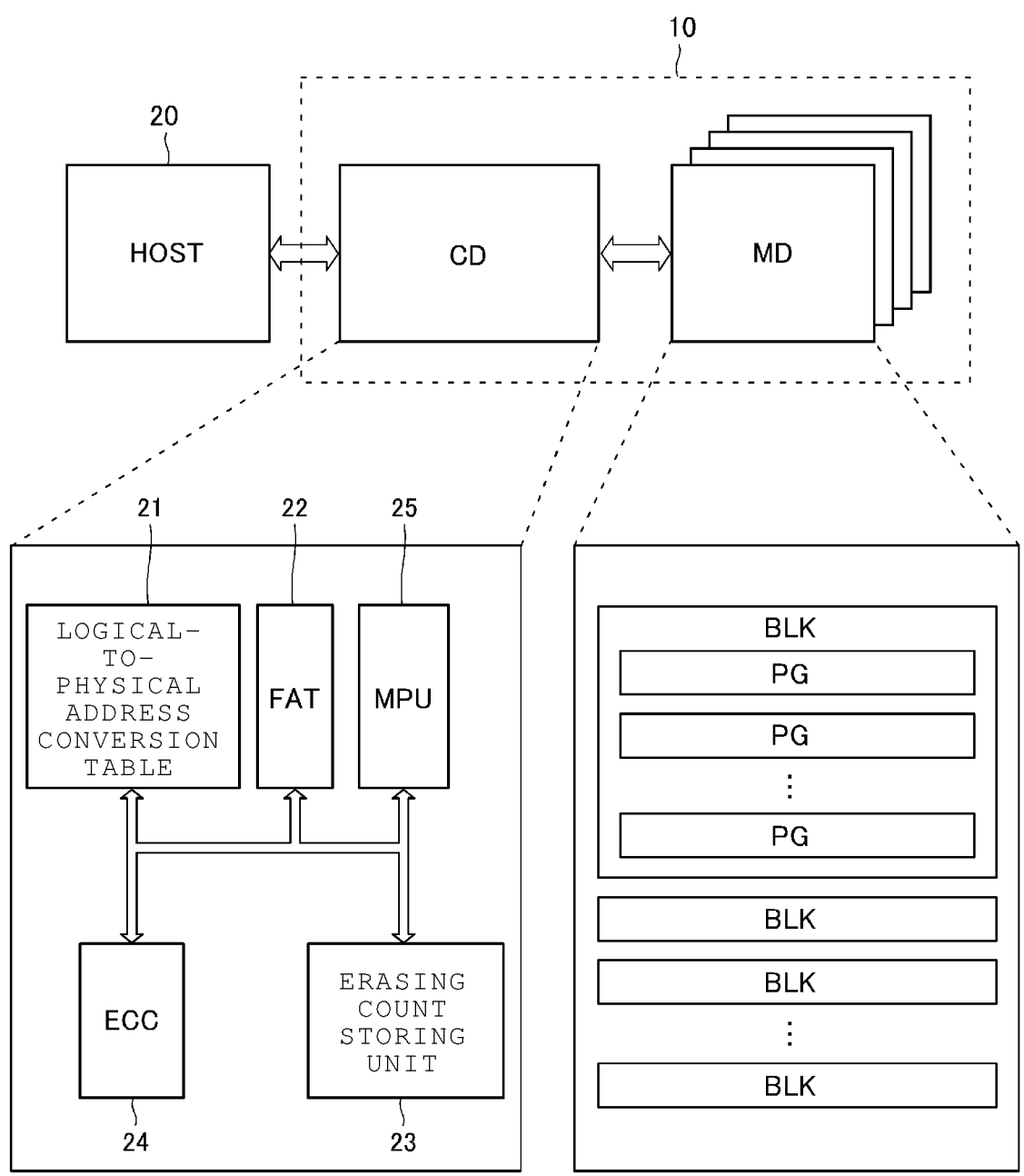
FIG. 1 is a block diagram schematically showing a configuration of a memory system according to a first embodiment.

Embodiments provide a semiconductor memory device with a reduced operating current.

In general, according to an embodiment, a semiconductor storage device includes a memory string including a plurality of memory transistors connected in series, a plurality of word lines connected to gates of the memory transistors, respectively, and a control circuit. The control circuit is configured to in response to a first command set, perform a first read operation, and in response to a second command set received during the first read operation, perform a second read operation after the first read operation. During the first read operation, a voltage of a first selected one of the word lines with which data is to be read is decreased from a read pass voltage to a first read voltage and then increased to the read pass voltage. During the second read operation, a voltage of a second selected one of the word lines with which data is to be read is set to a second read voltage and then increased to the read pass voltage. Voltages of word lines that are neither selected during the first read operation nor the second read operation are maintained between the first read operation and the second read operation.

Next, a semiconductor memory device according to an embodiment is described in detail by referring to drawings. It should be noted that the following embodiments are only examples and are not intended to limit the present disclosure. In addition, the following drawings are schematic, and some configurations may be omitted for the sake of description. Also, in some cases, the common parts of a plurality of embodiments are denoted by the same symbol and the description thereof is omitted.

In addition, "semiconductor memory device" in the present disclosure may mean a memory die, or a memory system including a controller die such as a memory chip, a memory card, or a solid state drive (SSD). Furthermore, the term may mean a configuration including a host computer such as a smartphone, a tablet terminal, a personal computer, and the like.

In addition, "control circuit" in the present disclosure may mean a peripheral circuit such as a sequencer provided in a memory die, a controller die or a controller chip connected to the memory die, or a configuration including both.

Also, when a first component is "electrically connected" to a second component in the present disclosure, the first component may be directly connected to the second component, or the first component may be connected to the second component via a wiring, semiconductor members, or transistors. For example, when three transistors are connected in series, even if the second transistor is in OFF state, a first transistor is "electrically connected" to a third transistor.

In addition, in the present disclosure, when the first component is "connected between" the second component and a third component, it may mean that the first component, the second component, and the third component are connected in series, and the second component is connected through the first component.

Also, in the present disclosure, when it is said that a circuit or the like "conducts" two wirings or the like, it may mean that for example, the circuit or the like includes a transistor or the like, the transistor or the like is provided in a current path between two wirings, and the transistor or the like goes to ON state.

In the present disclosure, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In the present disclosure, a direction along a predetermined surface may be referred to as a first direction, a direction crossing the first direction along the predetermined surface may be referred to as a second direction, and a direction crossing the predetermined surface may be referred to as a third direction. These first, second and third directions may or may not correspond to any of the X, Y and Z directions.

In the present disclosure, "top" and "bottom" are based on the substrate. For example, the direction away from the substrate along the Z direction is referred to as upward, and the direction approaching the substrate along the Z direction is referred to as downward. When referring to the lower surface or lower end of a certain component, it means the surface or end part on the substrate side of the component, and when referring to the upper surface or upper end, it means the surface or end part opposite to the substrate of the component. Further, a surface crossing the X direction or the Y direction is referred to as a side surface or the like.

First Embodiment

Memory System 10

FIG. 1 is a block diagram schematically showing a configuration of the memory system 10 according to a first embodiment.

The memory system 10 reads, writes, or erases user data according to a signal transmitted from a host computer 20. The memory system 10 is a system capable of storing user data such as a memory chip, a memory card, an SSD, or the like. The memory system 10 includes a plurality of memory dies MD and a controller die CD.

The memory die MD stores user data. The memory die MD includes a plurality of memory blocks BLK. The memory block BLK includes a plurality of pages PG. The memory block BLK may be an execution unit of an erasing operation. The page PG may be an execution unit of a read operation and a write operation.

The controller die CD is connected to the plurality of memory dies MD and the host computer 20 as shown in FIG. 1. The controller die CD includes, for example, a logical-to-physical address conversion table 21, a file allocation table (FAT) 22, an erasing count storing unit 23, an ECC circuit 24, and a microprocessor unit (MPU) 25.

The logical-to-physical address conversion table 21 stores a logical address received from the host computer 20 and a physical address allocated to a page PG in the memory die MD in association with each other. The logical-to-physical address conversion table 21 is implemented, for example, by random access memory (RAM) not shown in the drawing.

The FAT 22 stores FAT information indicating the state of each page PG. As such FAT information, for example, information indicating "valid", "invalid" and "erased" is provided. For example, a "valid" page PG stores valid data that can be read in response to an instruction from the host computer 20. Also, an "invalid" page PG stores invalid data that is not read in response to an instruction from the host computer 20. Further, data is not stored in an "erased" page PG after erasing processing is executed. For example, the FAT 22 is implemented by RAM or the like not shown in the drawing.

The erasing count storing unit 23 stores a physical address corresponding to the memory block BLK and the number of erasing operations executed to the memory block BLK in association with each other. The erasing count storing unit 23 is implemented by, for example, RAM or the like not shown in the drawing.

The ECC circuit 24 detects an error of data read from a memory die MD and corrects the data when possible.

The MPU 25 refers to the logical-to-physical address conversion table 21, the FAT 22, the erasing count storing unit 23, and the ECC circuit 24 to perform processing such as conversion of a logical address to a physical address, bit error detection/correction, garbage collection (also referred to as "compaction"), and wear leveling.

Figure 2:
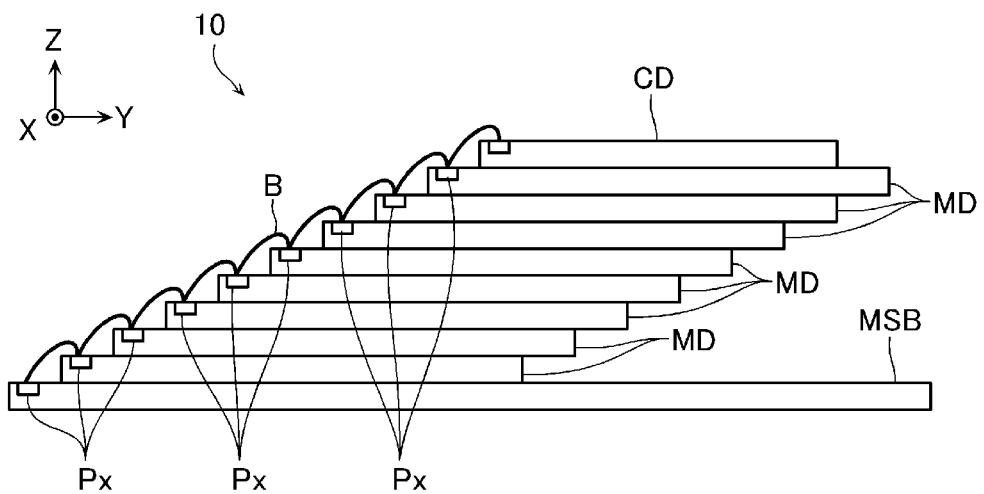
FIG. 2 is a side view diagram schematically showing an example of the configuration of the memory system.
Figure 3:
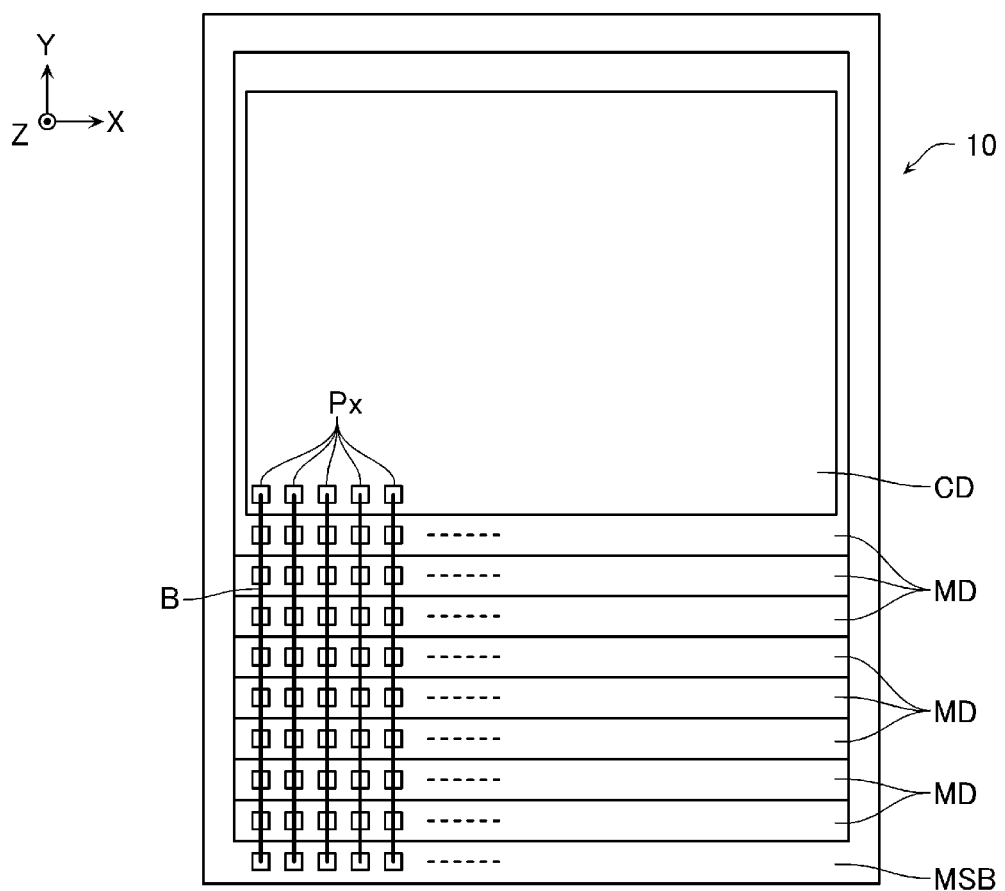
FIG. 3 is a plan view diagram schematically showing an example of the configuration of the memory system.

FIG. 2 is a side view diagram schematically showing an example of a configuration of the memory system 10 according to the present embodiment. FIG. 3 is a plan view diagram schematically showing the example of the configuration. For convenience of description, a part of the configuration is omitted in FIGS. 2 and 3.

As shown in FIG. 2, the memory system 10 according to the present embodiment includes a mounting substrate MSB, the plurality of memory dies MD, and a controller die CD. A pad electrode Px is provided in a region of the end part of the upper surface of the mounting substrate MSB in the Y direction. In the upper surfaces of the mounting substrate MSB, a region other than the end part in the Y direction is bonded to the lower surface of the memory die MD with an adhesive or the like. The plurality of memory dies MD are stacked on the mounting substrate MSB. A pad electrode Px is provided in a region of the end part of the upper surface of the memory die MD in the Y direction. In the upper surface of the memory die MD, a region other than the end part in the Y direction is bonded to the lower surface of the other memory die MD or the controller die CD with an adhesive or the like. The controller dies CD are stacked on the memory die MD. A pad electrode Px is provided in a region of the end part of the upper surface of the controller die CD in the Y direction.

As shown in FIG. 3, the mounting substrate MSB, the plurality of memory dies MD, and the controller die CD include a plurality of pad electrodes Px located in the X direction, respectively. The plurality of pad electrodes Px provided on the mounting substrate MSB, the plurality of memory dies MD, the controller die CD are connected to each other via a bonding wire B, respectively.

It should be noted that the configuration shown in FIGS. 2 and 3 is only an example, and the specific configuration may be modified appropriately. For example, in the examples shown in FIGS. 2 and 3, the controller dies CD are stacked on the plurality of memory dies MD. The memory die MD and the controller die CD are connected by the bonding wire B. The plurality of memory dies MD and controller dies CD are provided in one package. Alternatively, the controller dies CD may be provided in a separate package from the memory die MD. In addition, the plurality of memory dies MD and controller dies CD may be connected to each other via a through via or the like instead of the bonding wire B.

Circuit Configuration of Memory Die MD

Figure 4:
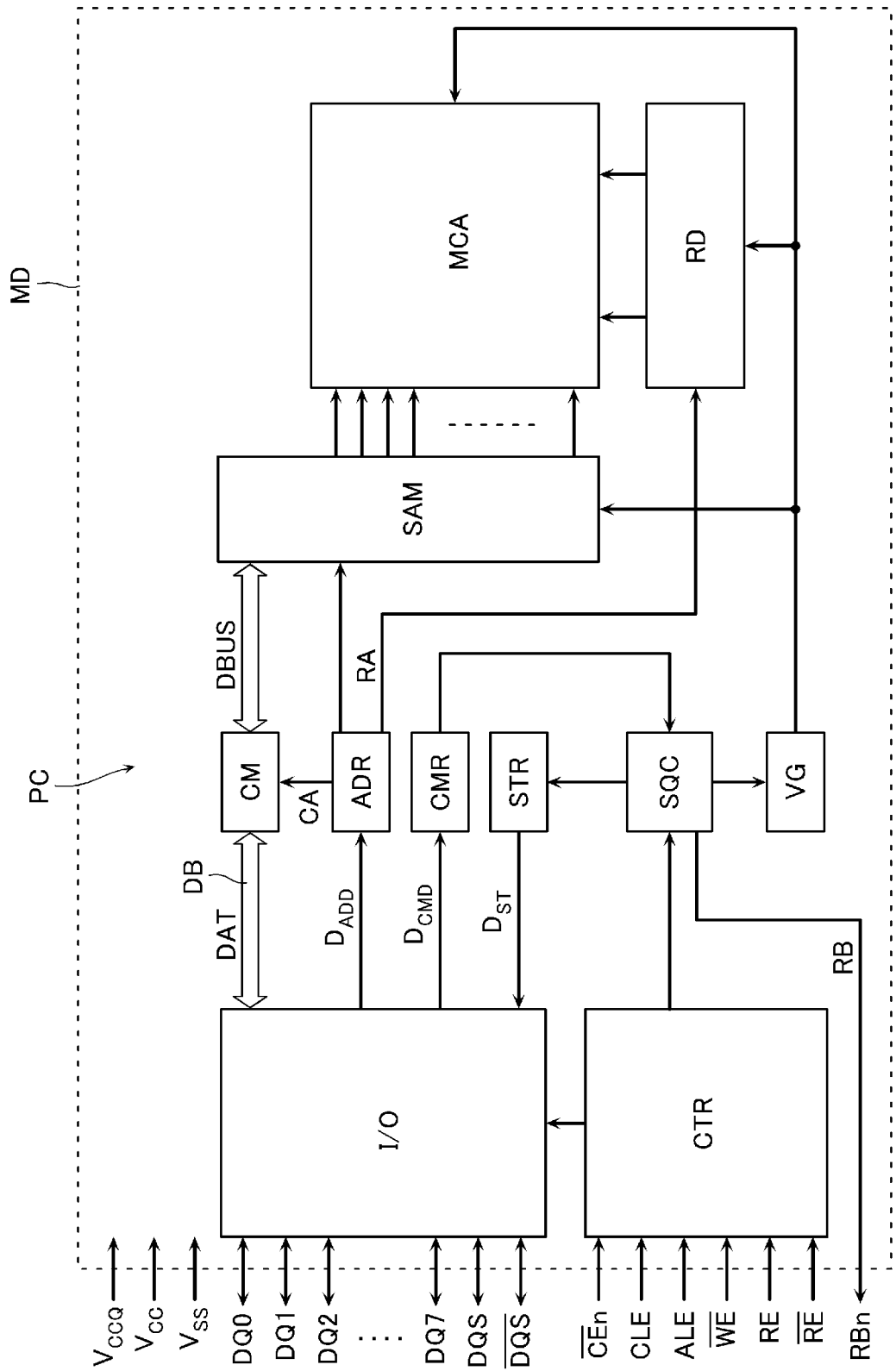
FIG. 4 is a block diagram schematically showing a configuration of a memory die MD in the first embodiment.

FIG. 4 is a block diagram schematically showing a configuration of the memory die MD according to the first embodiment. FIGS. 5 to 11 are circuit diagrams schematically showing the configuration of various parts of the memory die MD.

A plurality of control terminals or the like are shown in FIG. 4. The plurality of control terminals may be represented as control terminals corresponding to high-active signals (e.g., positive logic signals). Also, the plurality of control terminals may be represented as control terminals corresponding to low-active signals (e.g., negative logic signals). Also, the plurality of control terminals may be represented as control terminals corresponding to both the high-active signals and the low-active signals. In FIG. 4, the code of the control terminal corresponding to the low-active signal includes an overline (i.e., upper line). In the present disclosure, the code of the control terminal corresponding to the low-active signal includes a slash ("/"). In addition, the description in FIG. 4 is an example, and the specific form may be modified appropriately. For example, it is possible to use low-active signals instead of a part or all of the high-active signals or to use high-active signals instead of a part or all of the low-active signals.

As shown in FIG. 4, the memory die MD includes a memory cell array MCA and a peripheral circuit PC. The peripheral circuit PC includes a voltage generation circuit VG, a row decoder RD, a sense amplifier module SAM, and a sequencer SQC. Further, the peripheral circuit PC includes a cache memory CM, the address register ADR, a command register CMR, and a status register STR. Further, the peripheral circuit PC includes an input/output control circuit I/O and a logic circuit CTR.

Circuit Configuration of Memory Cell Array MCA

Figure 5:
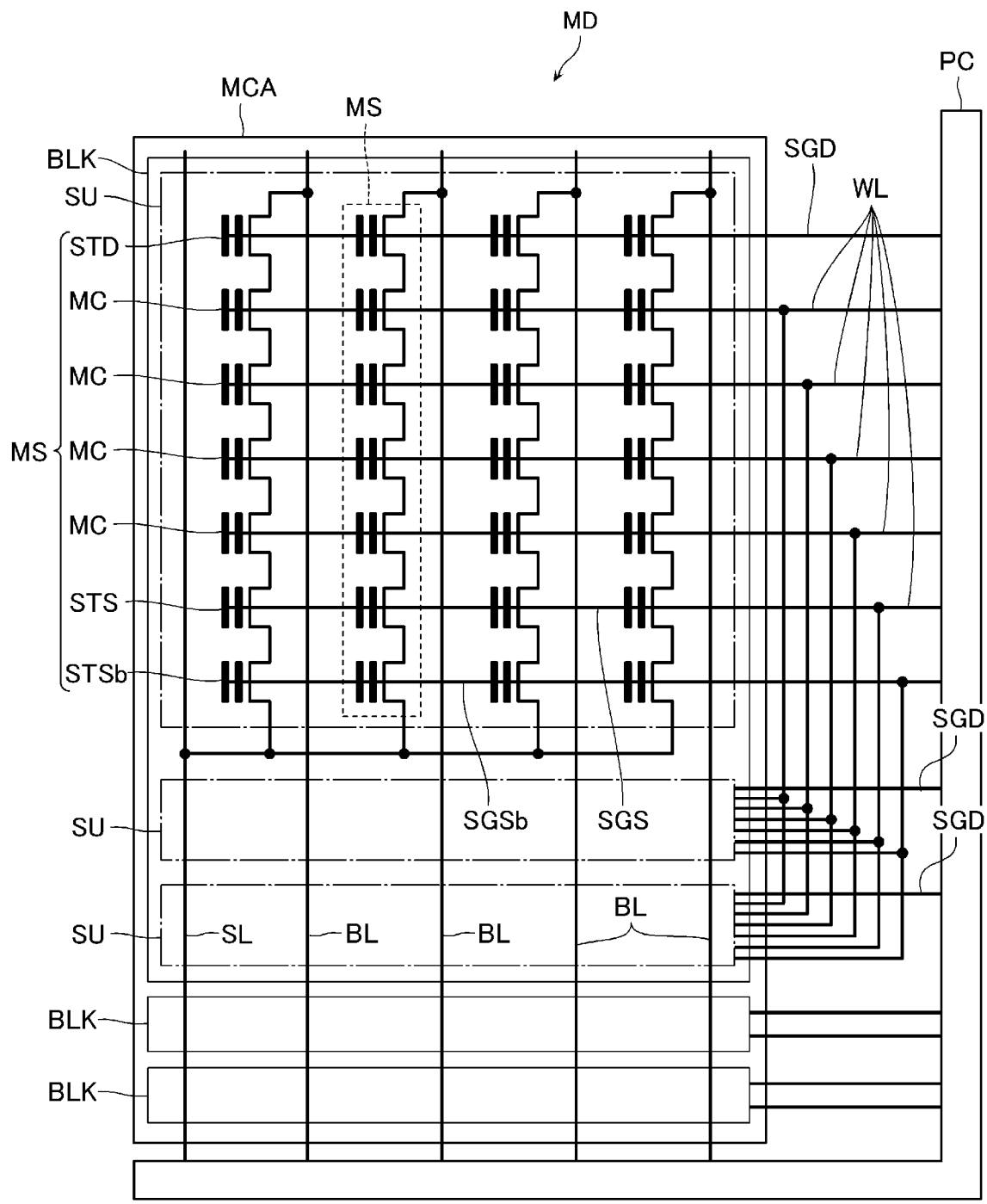
FIG. 5 is a circuit diagram schematically showing a configuration of a part of the memory die MD.

The memory cell array MCA includes the plurality of memory blocks BLK as shown in FIG. 5. Each of the plurality of memory blocks BLK includes a plurality of string units SU. Each of the plurality of string units SU includes a plurality of memory strings MS. Each end of the plurality of memory strings MS is connected to the peripheral circuit PC via a bit line BL. Also, the other ends of the plurality of memory strings MS are connected to the peripheral circuit PC via a common source line SL.

The memory string MS includes a drain-side select transistor STD, a plurality of memory cells MC (e.g., memory transistors), a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. Hereafter, the drain-side select transistor STD, the source-side select transistor STS, the source-side select transistor STSb may be simply referred to as a select transistor (STD, STS, and STSb).

The memory cell MC is a field effect type transistor. The memory cell MC includes a semiconductor layer, a gate insulating film, and a gate electrode. The semiconductor layer functions as a channel region. The gate insulating film includes a charge storage film. A threshold voltage of the memory cell MC varies according to the amount of charge in the charge storage film. The memory cell MC stores one bit or a plurality of bits of data. Word lines WL are respectively connected to the gate electrodes of the plurality of memory cells MC corresponding to one memory string MS. Each of these word lines WL is connected in common to all memory strings MS in one memory block BLK.

The select transistor (STD, STS, and STSb) is a field effect type transistor. The select transistor (STD, STS, and STSb) includes a semiconductor layer, a gate insulating film, and a gate electrode. The semiconductor layer functions as a channel region. Select gate lines (SGD, SGS, and SGSb) are connected to the gate electrodes of the select transistors (STD, STS, and STSb), respectively. The drain-side select gate line SGD is connected in common to all memory strings MS in one string unit SU. The source-side select gate line SGS is connected in common to all memory strings MS in one memory block BLK. The source-side select gate line SGSb is connected in common to all memory strings MS in one memory block BLK.

Circuit Configuration of Voltage Generation Circuit VG

Figure 6:
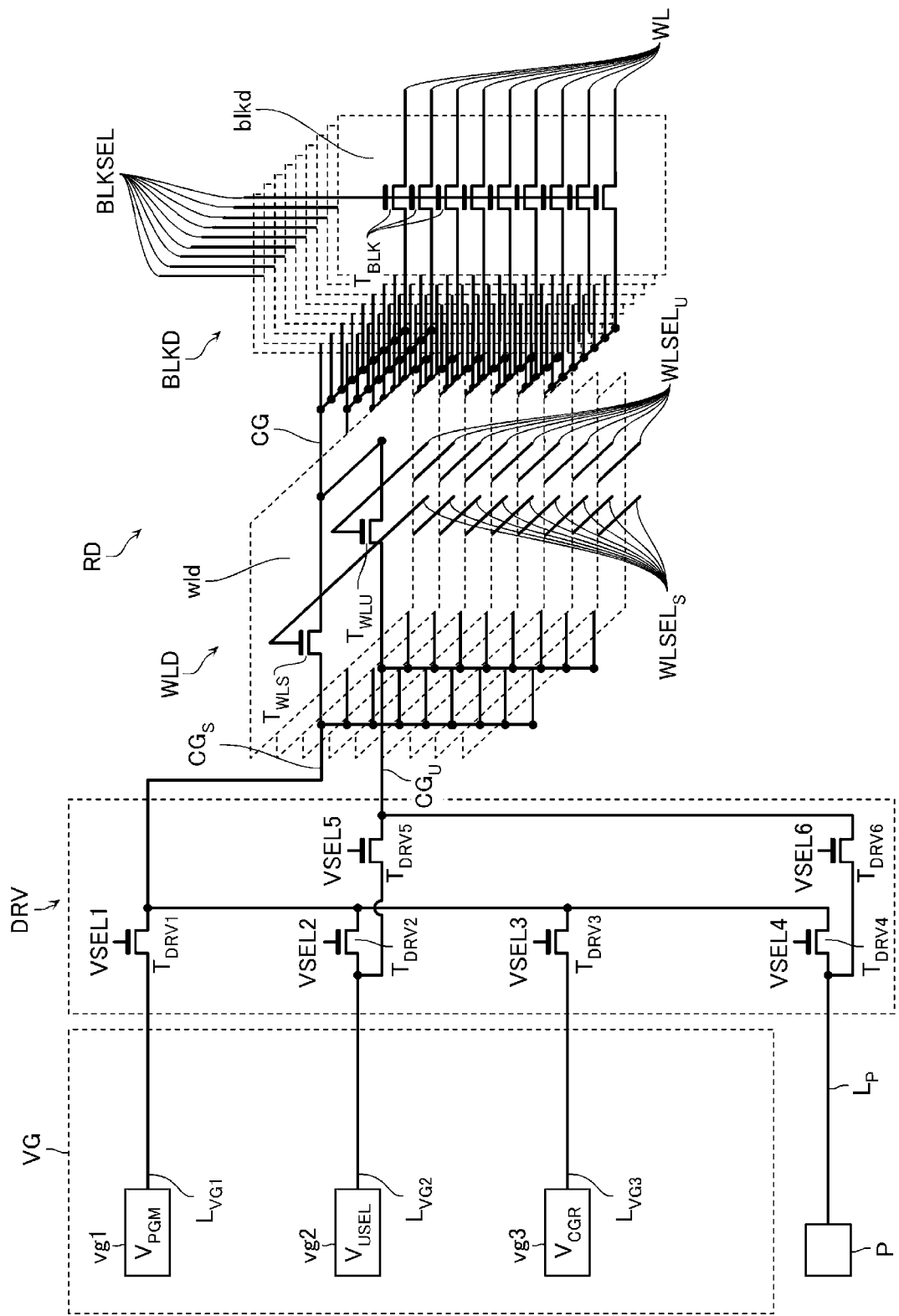
FIG. 6 is a circuit diagram schematically showing a configuration of another part of the memory die MD.

The voltage generation circuit VG (FIG. 4) includes a plurality of voltage generation units vg1 to vg3, for example, as shown in FIG. 6. The voltage generation units vg1 to vg3 generate voltages having predetermined magnitudes and output the voltages via voltage supply lines $L_{VG}$ ($L_{VG1}$ to $L_{VG3}$) in a read operation, a write operation, and an erasing operation. For example, the voltage generation unit vg1 outputs a program voltage used in a write operation. The voltage generation unit vg2 outputs a read path voltage $V_{READ}$ or the like in a read operation. The voltage generation unit vg2 outputs a write path voltage used in a write operation. The voltage generation unit vg3 outputs a read voltage in a read operation. The voltage generation unit vg3 outputs a verification voltage in a write operation. For example, the voltage generation units vg1 to vg3 may be a step-up circuit such as a charge pump circuit or a step-down circuit such as a regulator. Each of these step-down circuits and step-up circuits is connected to a voltage supply line $L_P$. A power supply voltage $V_{CC}$ or a ground voltage $V_{SS}$ (FIG. 4) is supplied to the voltage supply line $L_P$. For example, these voltage supply lines $L_P$ are connected to the pad electrodes Px described with reference to FIGS. 2 and 3. An operating voltage output from the voltage generation circuit VG is appropriately adjusted according to a control signal from the sequencer SQC.

A charge pump circuit 32 (FIG. 7) in the voltage generation circuit VG includes a voltage output circuit 32a, a voltage divider circuit 32b, and a comparator 32c. The voltage output circuit 32a outputs a voltage $V_{OUT}$ to the voltage supply line $L_{VG}$. The voltage divider circuit 32b is connected to the voltage supply line $L_{VG}$. The comparator 32c outputs a feedback signal FB to the voltage output circuit 32a according to a magnitude relationship between a voltage $V_{OUT}'$ output from the voltage divider circuit 32b and a reference voltage $V_{REF}$.

Figure 8:
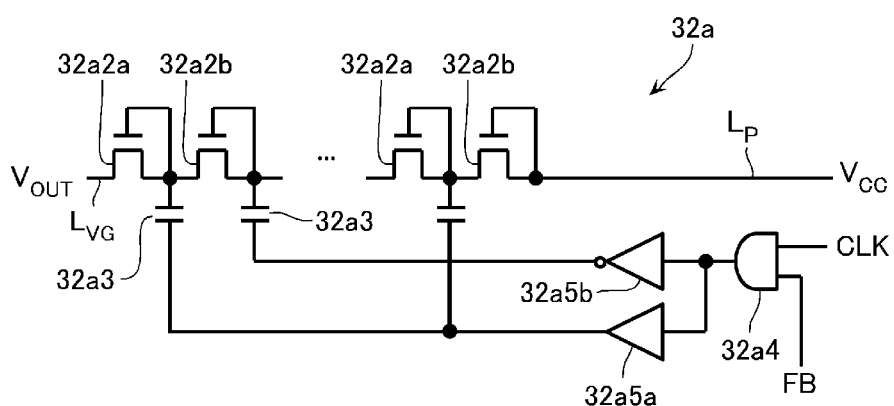
FIG. 8 is a circuit diagram schematically showing a configuration of still another part of the memory die MD.

The voltage output circuit 32a includes a plurality of transistors 32a2a and 32a2b as shown in FIG. 8. The plurality of transistors 32a2a and 32a2b are alternately connected between the voltage supply line $L_{VG}$ and the voltage supply line $L_P$. The power supply voltage VCC is supplied to the voltage supply line LP as shown in FIG. 8. Gate electrodes of the plurality of transistors 32a2a and 32a2b connected in series are connected to respective drain electrodes and capacitors 32a3. The voltage output circuit 32a includes an AND circuit 32a4, a level shifter 32a5a, and a level shifter 32a5b. The AND circuit 32a4 outputs the OR of a clock signal CLK and the feedback signal FB. The level shifter 32a5a boosts and outputs an output signal of the AND circuit 32a4. An output terminal of the level shifter 32a5a is connected to a gate electrode of the transistor 32a2a through the capacitor 32a3. The level shifter 32a5b boosts and outputs an inversion signal of the output signal of the AND circuit 32a4. An output terminal of the level shifter 32a5b is connected to a gate electrode of the transistor 32a2b through the capacitor 32a3.

If the feedback signal FB is in "H" state, the clock signal CLK is output from the AND circuit 32a4. As a result, electrons are transferred from the voltage supply line $L_{VG}$ to the voltage supply line $L_P$, and the voltage of the voltage supply line $L_{VG}$ increases. If the feedback signal FB is in "L" state, on the other hand, the clock signal CLK is not output from the AND circuit 32a4. As a result, the voltage of the voltage supply line $L_{VG}$ is not increased.

Figure 7:
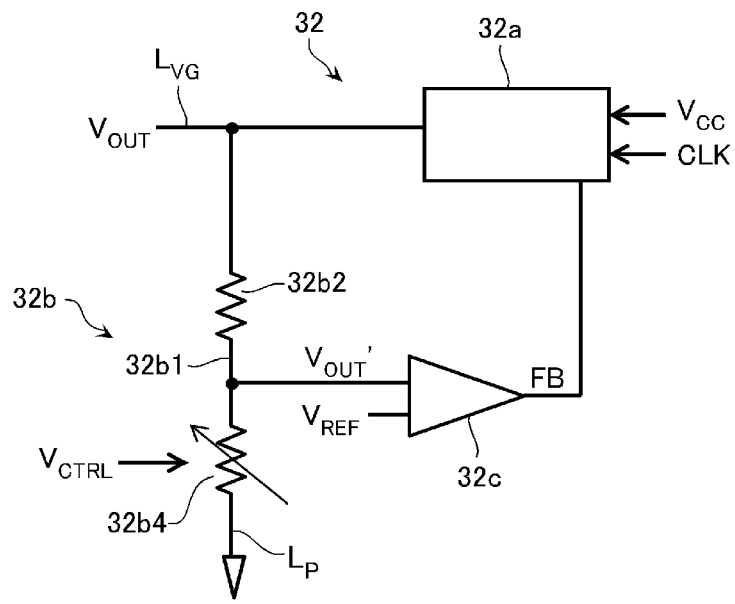
FIG. 7 is a circuit diagram schematically showing a configuration of still another part of the memory die MD.

The voltage divider circuit 32b includes a resistance element 32b2 and a variable resistance element 32b4 as shown in FIG. 7. The resistance element 32b2 is connected between the voltage supply line $L_{VG}$ and a voltage dividing terminal 32b1. The variable resistance element 32b4 is connected in series between the voltage dividing terminal 32b1 and the voltage supply line $L_P$. The ground voltage $V_{SS}$ is supplied to the voltage supply line $L_P$. The resistance value of the variable resistance element 32b4 can be adjusted according to the operation voltage control signal $V_{CTRL}$. Accordingly, the magnitude of the voltage $V_{OUT}'$ of the voltage dividing terminal 32b1 can be adjusted according to the operation voltage control signal $V_{CTRL}$.

Figure 9:
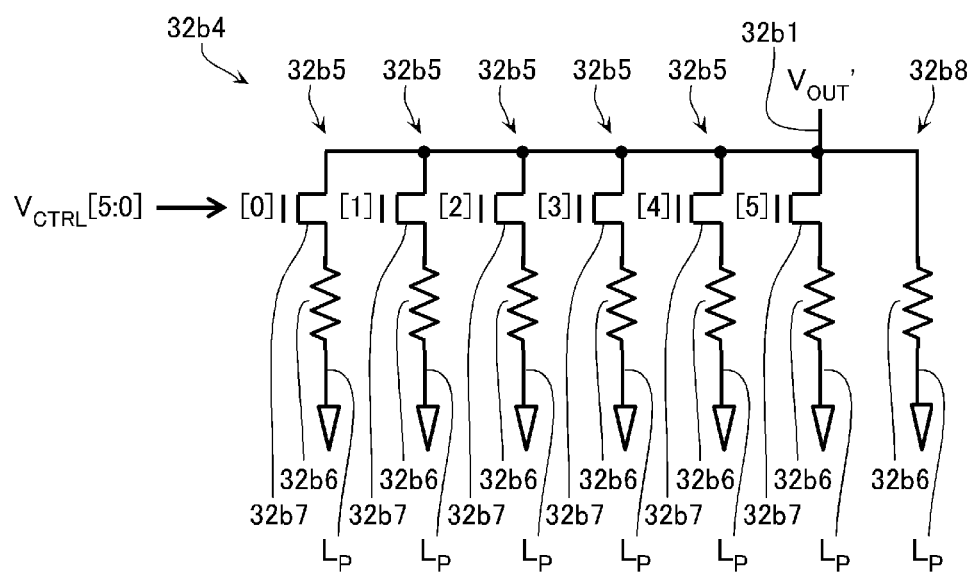
FIG. 9 is a circuit diagram schematically showing a configuration of still another part of the memory die MD.

The variable resistance element 32b4 includes a plurality of current paths 32b5 as shown in FIG. 9. The plurality of current paths 32b5 are connected in parallel between the voltage dividing terminal 32b1 and the voltage supply line $L_P$. The plurality of current paths 32b5 include a resistance element 32b6 and a transistor 32b7 connected in series, respectively. The resistance values of the resistance elements 32b6 provided in each current path 32b5 may be different from each other. Different bits of the operation voltage control signal $V_{CTRL}$ are input to a gate electrode of the transistor 32b7. Further, the variable resistance element 32b4 may have a current path 32b8 not including the transistor 32b7.

The comparator 32c outputs the feedback signal FB as shown in FIG. 7. For example, the feedback signal FB goes to "L" state when the voltage $V_{OUT}'$ of the voltage dividing terminal 32b1 is larger than the reference voltage $V_{REF}$. Also, for example, the feedback signal FB goes to "H" state when the voltage $V_{OUT}'$ is smaller than the reference voltage $V_{REF}$.

Circuit Configuration of Row Decoder

As shown in FIG. 6, the row decoder RD includes, for example, a block decoder BLKD, a word line decoder WLD, a driver circuit DRV, and an address decoder not shown.

The block decoder BLKD includes a plurality of block decoding units blkd. The plurality of block decoding units blkd respectively correspond to the plurality of memory blocks BLK in the memory cell array MCA. The block decoding unit blkd includes a plurality of transistors $T_{BLK}$. The plurality of transistors $T_{BLK}$ correspond to a plurality of word lines WL in the memory block BLK. The transistor $T_{BLK}$ is, for example, an NMOS transistor of a field effect type. The drain electrode of the transistor $T_{BLK}$ is connected to the word line WL. The source electrode of the transistor $T_{BLK}$ is connected to a wiring CG. The wiring CG is connected to all block decoding units blkd in the block decoder BLKD. The gate electrode of the transistor $T_{BLK}$ is connected to a signal line BLKSEL. A plurality of signal lines BLKSEL are provided corresponding to all block decoding units blkd. Also, the signal line BLKSEL is connected to all transistors $T_{BLK}$ in the block decoding unit blkd.

In a read operation and a write operation, for example, the voltage of one signal line BLKSEL corresponding to a block address in the address register ADR (FIG. 4) goes to "H" state, and the voltages of the other signal lines BLKSEL go to "L" state. For example, a predetermined driving voltage having a positive magnitude is supplied to one signal line BLKSEL, and the ground voltage $V_{SS}$ or the like is supplied to other signal lines BLKSEL. Consequently, all word lines WL in one memory block BLK corresponding to the block address conduct all wirings CG. Also, all word lines WL in the other memory block BLK go to floating states.

The word line decoder WLD includes a plurality of word line decoding units wld. The plurality of word line decoding units wld respectively correspond to the plurality of memory cells MC in the memory string MS. In the shown example, a word line decoding unit wld includes two transistors $T_{WLS}$ and $T_{WLU}$. For example, the transistors $T_{WLS}$ and $T_{WLU}$ are field effect type NMOS transistors. The drain electrodes of the transistors $T_{WLS}$ and $T_{WLU}$ are connected to the wiring CG. The source electrode of the transistor $T_{WLS}$ is connected to a wiring $CG_S$. The source electrode of the transistor $T_{WLU}$ is connected to a wiring $CG_U$. The gate electrode of the transistor $T_{WLS}$ is connected to a signal line $WLSEL_S$. The gate electrode of the transistor $T_{WLU}$ is connected to a signal line $WLSEL_U$. A plurality of signal lines $WLSEL_S$ are provided corresponding to one transistor $T_{WLS}$ provided in all word line decoding units wld. A plurality of signal lines $WLSEL_U$ are provided corresponding to other transistors $T_{WLU}$ provided in all word line decoding units wld.

In a read operation and a write operation, for example, the voltage of the signal line $WLSEL_S$ corresponding to one word line decoding unit wld corresponding to a page address in the address register ADR (FIG. 4) goes to "H" state, and the voltage of the signal line $WLSEL_U$ corresponding thereto goes to "L" state. The voltage of the signal lines $WLSEL_S$ corresponding to the other word lines decoding unit wld goes to "L" state, and the voltage of the signal line $WLSEL_U$ corresponding thereto goes to "H" state. The voltage corresponding to a selected word line $WL_S$ is supplied to the wiring $CG_S$. The voltage corresponding to a non-selected word lines $WL_U$ is supplied to the wiring $CG_U$. Consequently, the voltage corresponding to the selected word line $WL_S$ is supplied to one word line WL corresponding to the page address. The voltage corresponding to the non-selected word line $WL_U$ is supplied to the other word lines WL.

The driver circuit DRV includes, for example, six transistors $T_{DRV1}$ to $T_{DRV6}$. For example, the transistors $T_{DRV1}$ to $T_{DRV6}$ are field effect type NMOS transistors. The drain electrodes of the transistors $T_{DRV1}$ to $T_{DRV4}$ are connected to the wiring $CG_S$. The drain electrodes of the transistors $T_{DRV5}$ and $T_{DRV6}$ are connected to the wiring $CG_U$. The source electrode of the transistor $T_{DRV1}$ is connected to the output terminal of the voltage generation unit vg1 via the voltage supply line $L_{VG1}$. The source electrodes of the transistors $T_{DRV2}$ and $T_{DRV5}$ are connected to the output terminal of the voltage generation unit vg2 via the voltage supply line $L_{VG2}$. The source electrode of the transistor $T_{DRV3}$ is connected to the output terminal of the voltage generation unit vg3 via the voltage supply line $L_{VG3}$. The source electrodes of the transistors $T_{DRV4}$ and $T_{DRV6}$ are connected to the pad electrode Px described with reference to FIGS. 2 and 3 via the voltage supply line $L_P$. Signal lines VSEL1 to VSEL6 are connected to the gate electrodes of the transistors $T_{DRV1}$ to $T_{DRV6}$, respectively.

In a read operation, a write operation, or the like, for example, a voltage of one of a plurality of signal lines VSEL1 to VSEL4 corresponding to the wiring $CG_S$ goes to "H" state, and the other voltages go to "L" state. Further, a voltage of one of the two signal lines VSEL5 and VSEL6 corresponding to the wiring $CG_U$ goes to "H" state and the other voltage goes to "L" state.

For example, an address decoder not shown in the drawing refers to a row address RA of the address register ADR (FIG. 4) sequentially according to a control signal from the sequencer SQC (FIG. 4). The row address RA includes the block address and the page address described above. The address decoder controls the voltages of the signal lines BLKSEL, $WLSEL_S$, and $WLSEL_U$ to "H" state or "L" state.

In the example shown in FIG. 6, the row decoder RD includes one block decoding unit blkd for one memory block BLK. However, this configuration may be changed appropriately. For example, one block decoding units blkd may be provided for two or more memory blocks BLK.

Circuit Configuration of Sense Amplifier Module SAM

Figure 10:
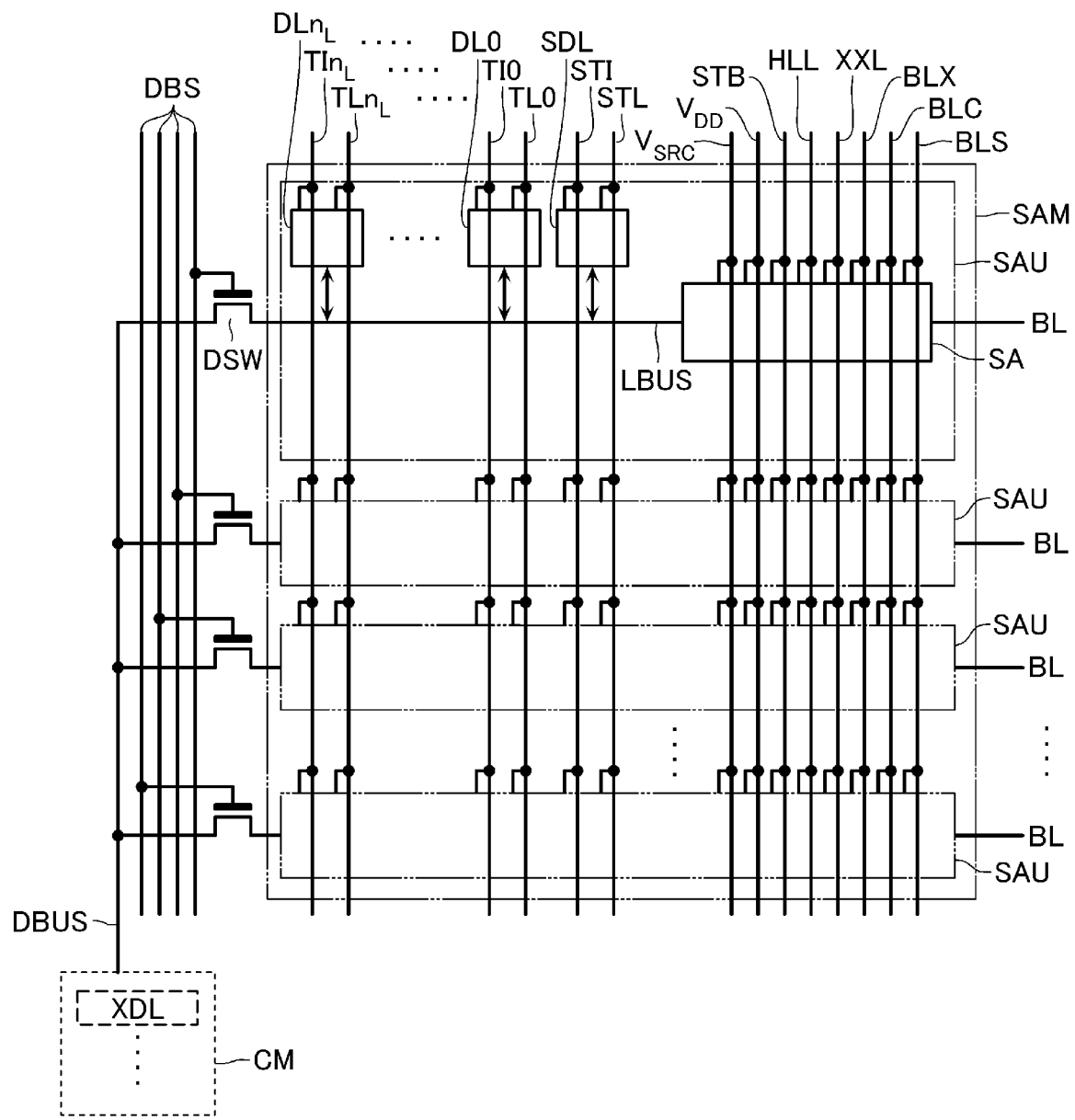
FIG. 10 is a circuit diagram schematically showing a configuration of still another part of the memory die MD.

The sense amplifier module SAM (FIG. 4) includes a plurality of sense amplifier units SAU as shown in FIG. 10. The plurality of sense amplifier units SAU correspond to a plurality of bit lines BL, respectively. Each of the sense amplifier units SAU includes a sense amplifier SA, a wiring LBUS, and latch circuits SDL and DL0 to $DLn_L$ (nL is a natural number). A charging transistor 55 (FIG. 11) for pre-charging is connected to the wiring LBUS. The wiring LBUS is connected to a wiring DBUS via a switch transistor DSW.

Figure 11:
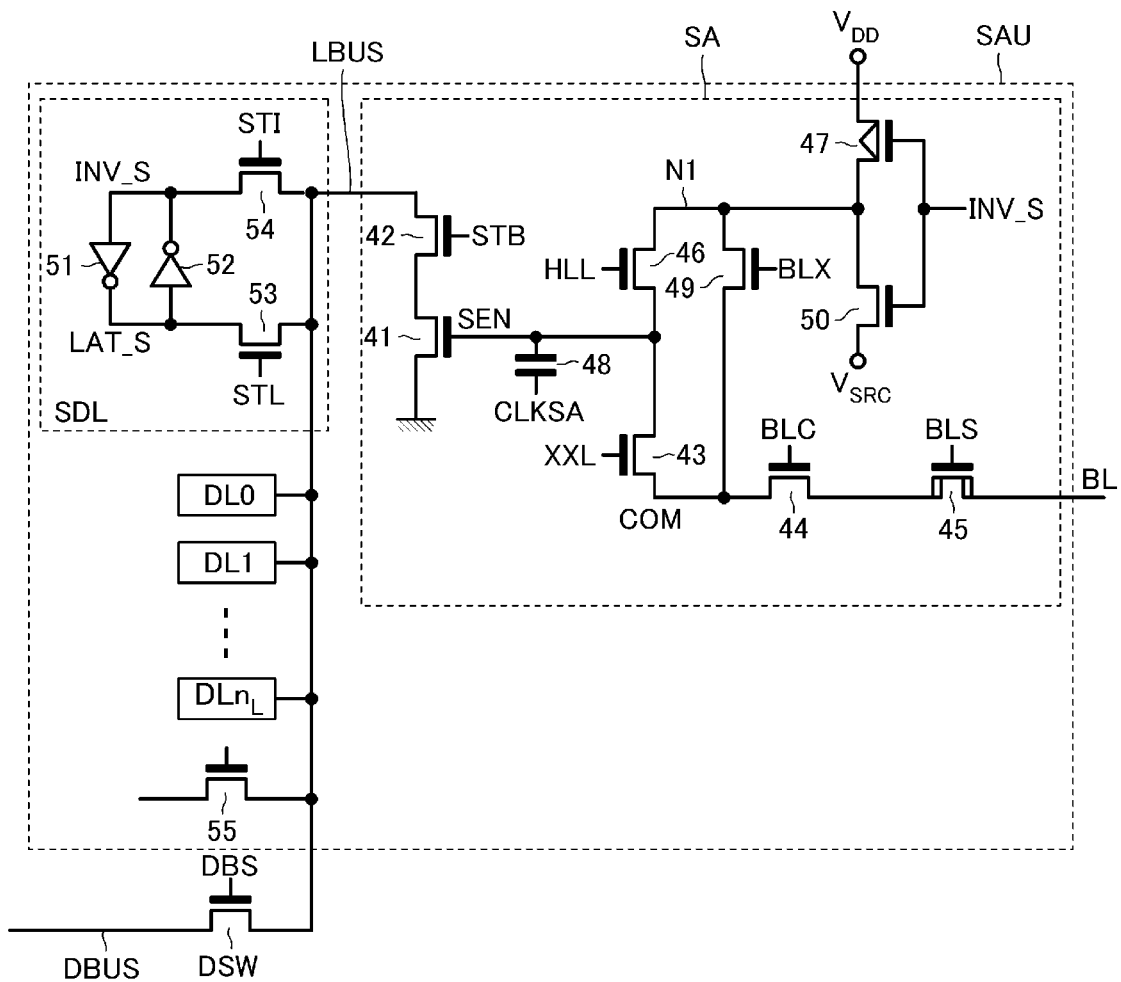
FIG. 11 is a circuit diagram schematically showing a configuration of still another part of the memory die MD.

The sense amplifier SA includes a sense transistor 41 as shown in FIG. 11. The sense transistor 41 discharges the charge of the wiring LBUS according to the current flowing in the bit line BL. The source electrode of the sense transistor 41 is connected to a voltage supply line to which the ground voltage $V_{SS}$ is supplied. A drain electrode is connected to the wiring LBUS via a switch transistor 42. A gate electrode is connected to the bit line BL via a sense node SEN, a discharge transistor 43, a node COM, a clamp transistor 44, and a breakdown voltage transistor 45. The sense node SEN is connected to an internal control signal line CLKSA via a capacitor 48.

Also, the sense amplifier SA includes a voltage transfer circuit. The voltage transfer circuit selectively conducts the node COM and the sense node SEN with a voltage supply line to which a voltage $V_{DD}$ is supplied or a voltage supply line to which a voltage $V_{SRC}$ is supplied according to data latched to the latch circuit SDL. The voltage transfer circuit includes a node N1, a charging transistor 46, a charging transistor 49, a charging transistor 47, and a discharge transistor 50. The charging transistor 46 is connected between the node N1 and the sense node SEN. The charging transistor 49 is connected between the node N1 and the node COM. The charging transistor 47 is connected between the node N1 and the voltage supply line to which the voltage $V_{DD}$ is supplied. The discharge transistor 50 is connected between the node N1 and the voltage supply line to which the voltage $V_{SRC}$ is supplied. In addition, the gate electrodes of the charging transistor 47 and the discharge transistor 50 are connected in common to a node INV_S of the latch circuit SDL.

In addition, the sense transistors 41, the switch transistors 42, the discharge transistor 43, the clamp transistor 44, the charging transistor 46, the charging transistor 49, and the discharge transistor 50 are enhancement type NMOS transistors, for example. The breakdown voltage transistor 45 is, for example, a depression type NMOS transistor. The charging transistor 47 is, for example, a PMOS transistor.

The gate electrode of the switch transistor 42 is connected to a signal line STB. The gate electrode of the discharge transistor 43 is connected to a signal line XXL. The gate electrode of the clamp transistor 44 is connected to a signal line BLC. The gate electrode of the breakdown voltage transistor 45 is connected to a signal line BLS. The gate electrode of the charging transistor 46 is connected to a signal line HLL. The gate electrode of the charging transistor 49 is connected to a signal line BLX. These signal lines STB, XXL, BLC, BLS, HLL, and BLX are connected to the sequencer SQC.

The latch circuit SDL includes nodes LAT_S, INV_S, an inverter 51, an inverter 52, a switch transistor 53, and a switch transistor 54. The inverter 51 includes an output terminal connected to a node LAT_S and an input terminal connected to the node INV_S. The inverter 52 includes an input terminal connected to the node LAT_S and an output terminal connected to the node INV_S. The switch transistor 53 is provided in a current path between the node LAT_S and the wiring LBUS. The switch transistor 54 is provided in a current path between the node INV_S and the wiring LBUS. For example, the switch transistors 53 and 54 are NMOS transistors. The gate electrode of the switch transistor 53 is connected to the sequencer SQC via a signal line STL. The gate electrode of the switch transistor 54 is connected to the sequencer SQC via a signal line STI.

The latch circuits DL0 to $DLn_L$ are configured almost the same as latch circuits SDL. However, as described above, the node INV_S of the latch circuit SDL is connected to the gate electrodes of the charging transistor 47 and the discharge transistor 50 in the sense amplifier SA. The latch circuits DL0 to $DLn_L$ differ from the latch circuit SDL in this respect.

The switch transistor DSW is, for example, an NMOS transistor. The switch transistor DSW is connected between the wiring LBUS and the wiring DBUS. The gate electrode of the switch transistor DSW is connected to the sequencer SQC via a signal line DBS.

As illustrated in FIG. 10, the signal lines STB, HLL, XXL, BLX, BLC and BLS are connected in common among all sense amplifier units SAU provided in the sense amplifier module SAM. A voltage supply line to which the voltage $V_{DD}$ is supplied and a voltage supply line to which the voltage $V_{SRC}$ is supplied are connected in common among all sense amplifier units SAU provided in the sense amplifier module SAM, respectively. The signal line STI and the signal line STL of the latch circuit SDL are connected in common among all sense amplifier units SAU provided in the sense amplifier module SAM, respectively. Similarly, signal lines TI0 to TIn$_L$ and TL0 to TLn$_L$ corresponding to the signal lines STI and STL in the latch circuits DL0 to DLn$_L$ are connected in common among all sense amplifier units SAU provided in the sense amplifier module SAM. A plurality of signal lines DBS are provided corresponding to all sense amplifier units SAU provided in the sense amplifier module SAM, respectively.

Circuit Configuration of Cache Memory CM

The cache memory CM (FIG. 4) includes a plurality of latch circuits XDL as shown in FIG. 10. The plurality of latch circuits XDL are connected to a latch circuit in the sense amplifier module SAM via the wiring DBUS. Data DAT stored in the plurality of latch circuits XDL are sequentially transferred to the sense amplifier module SAM or the input/output control circuit I/O.

A decoding circuit and a switch circuit not shown in FIG. 10 are connected to the cache memory CM. The decoding circuit decodes a column address CA stored in the address register ADR. A switch circuit causes a latch circuit corresponding to the column address CA to be conducted to a bus DB (FIG. 4) according to the output signal of the decoding circuit.

Circuit Configuration of Sequencer SQC

The sequencer SQC (FIG. 4) outputs an internal control signal to the row decoder RD, the sense amplifier module SAM, and the voltage generation circuit VG according to the command data D$_{CMD}$ stored in the command register CMR. The sequencer SQC outputs status data D$_{ST}$ indicating the own state thereof to the status register STR.

The sequencer SQC generates a ready/busy signal RB and outputs the ready/busy signal RB to a terminal RBn. The ready/busy signal RB is a signal for notifying the controller die CD whether it is a ready state in which a command from the controller die CD is acceptable or a busy state in which the command is not acceptable. Access to the memory die MD is basically prohibited in a period (busy period) during which the voltage of the terminal RBn is in "L" state. In a period (ready period) during which the voltage of the terminal RBn is in "H" state, access to the memory die MD is permitted. For example, the terminal RBn is implemented with the pad electrodes Px described with reference to FIGS. 2 and 3.

Circuit Configuration of Input/output control circuit I/O

The input/output control circuit I/O includes data signal input/output terminals DQ0 to DQ7, toggle signal input/output terminals DQS and /DQS, a plurality of input circuits, a plurality of output circuits, a shift register, and a buffer circuit. The plurality of input circuits, the plurality of output circuits, the shift register, and the buffer circuit are connected to terminals to which the power supply voltage V$_{CC}$ and the ground voltage V$_{SS}$ are supplied, respectively.

For example, the data signal input/output terminals DQ0 to DQ7, the toggle signal input/output terminals DQS and /DQS, and terminals to which the power supply voltage V$_{CC}$ is supplied are implemented by the pad electrodes Px described with reference to FIGS. 2 and 3. Data input via the data signal input/output terminals DQ0 to DQ7 is output from the buffer circuit to the cache memory CM, the address register ADR or the command register CMR according to the internal control signal from the logic circuit CTR. Data output via the data signal input/output terminals DQ0 to DQ7 is input to the buffer circuit from the cache memory CM or the status register STR according to the internal control signal from the logic circuit CTR.

The plurality of input circuits include, for example, a comparator connected to any of the data signal input/output terminals DQ0 to DQ7 or both of the toggle signal input/output terminals DQS and/DQS. The plurality of output circuits include, for example, an off chip driver (OCD) circuit connected to any of the data signal input/output terminals DQ0 to DQ7 or any of the toggle signal input/output terminals DQS and/DQS.

Circuit Configuration of Logic Circuit CTR

The logic circuit CTR (FIG. 4) receives external control signals from the controller die CD via external control terminals/CEn, CLE, ALE, /WE, RE, and /RE and outputs an internal control signal to the input/output control circuit I/O accordingly. For example, the external control terminals/CEn, CLE, ALE, /WE, RE, /RE are implemented with the pad electrodes Px described with reference to FIGS. 2 and 3.

Structure of Memory Die MD

Figure 12:
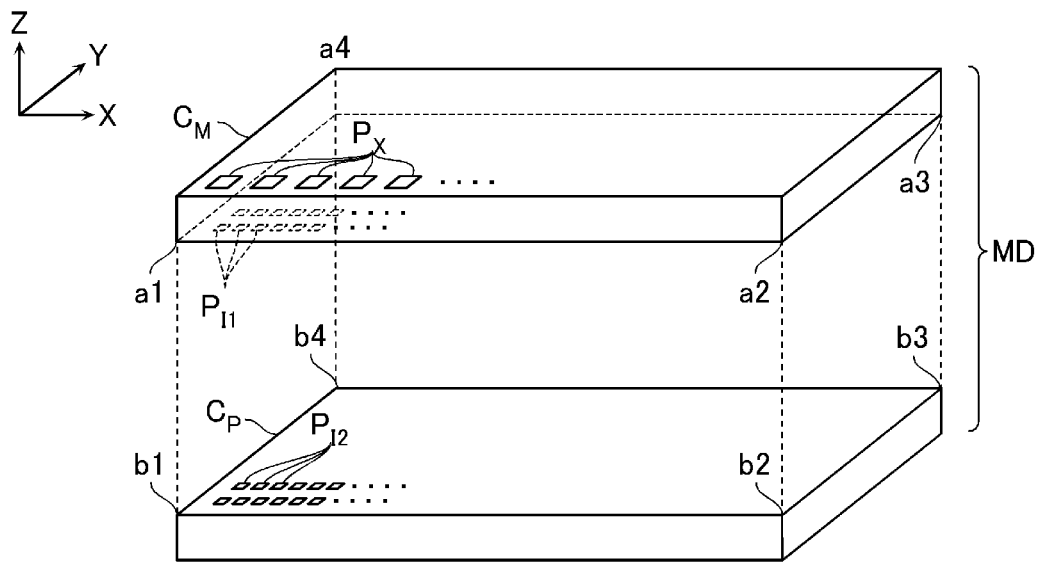
FIG. 12 is an exploded perspective diagram showing an example of a configuration of a semiconductor memory device according to the first embodiment.

FIG. 12 is an exploded perspective diagram schematically showing an example of the configuration of the semiconductor memory device according to the present embodiment. As shown in FIG. 12, the memory die MD includes a chip C$_M$ on the memory cell array MCA side and a chip C$_P$ on the peripheral circuit PC side.

A plurality of pad electrodes Px connectable to bonding wires not shown in FIG. 12 are provided on the upper surface of the chip C$_M$. A plurality of bonding electrodes P$_{I1}$, are provided on the lower surface of the chip C$_M$. A plurality of bonding electrodes P$_{I2}$ are provided on the upper surface of the chip C$_P$. As for the chip C$_M$, the surface with the plurality of bonding electrodes P$_{I1}$ is referred to as a front surface, and the surface with the plurality of pad electrodes Px is referred to as a back surface. As for the chip C$_P$, the surface with the plurality of bonding electrodes P$_{I2}$ is referred to as a front surface, and the surface on the opposite side of the front surface is referred to as a back surface. In the illustrated example, the front surface of the chip C$_P$ is provided above the back surface of the chip C$_P$ and the back surface of the chip C$_M$ is provided above the front surface of the chip C$_M$.

The chip C$_M$ and the chip C$_P$ are disposed so that the front surface of the chip C$_M$ faces the front surface of the chip C$_P$. The plurality of bonding electrodes P$_{I1}$ are respectively provided corresponding to the plurality of bonding electrodes P$_{I2}$ and disposed at positions which can be pasted to the plurality of bonding electrodes P$_{I2}$, respectively. The bonding electrode P$_{I1}$ and the bonding electrode P$_{I2}$ function as a bonding electrode for bonding the chip C$_M$ and the chip C$_P$ and conducting electrically.

In the example shown in FIG. 12, corner parts a1, a2, a3, and a4 of the chip C$_M$ correspond to corner parts b1, b2, b3, and b4 of the chip C$_P$, respectively.

Figure 13:
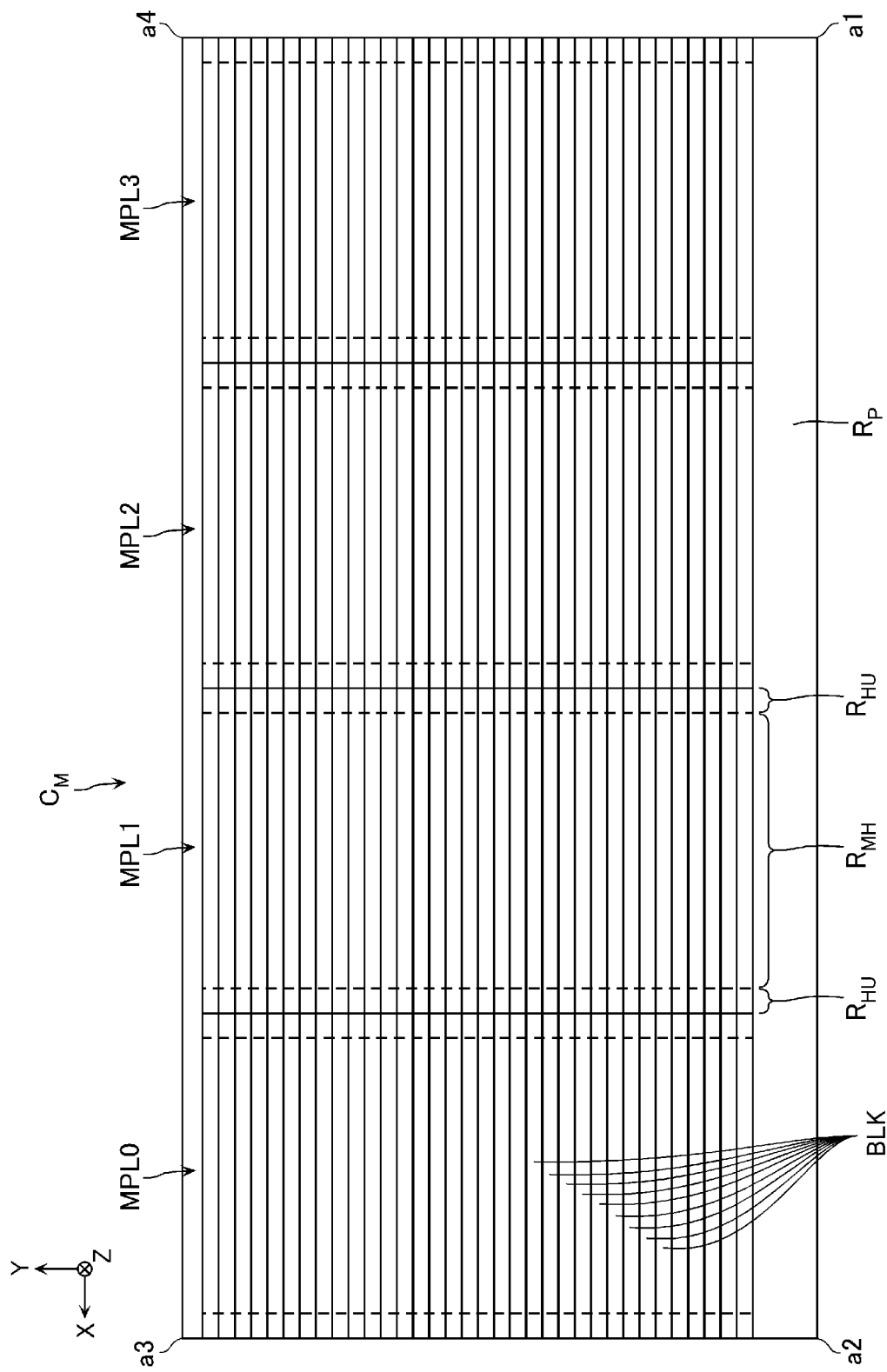
FIG. 13 is a bottom view diagram schematically showing an example of a configuration of a chip $C_M$.
Figure 14:
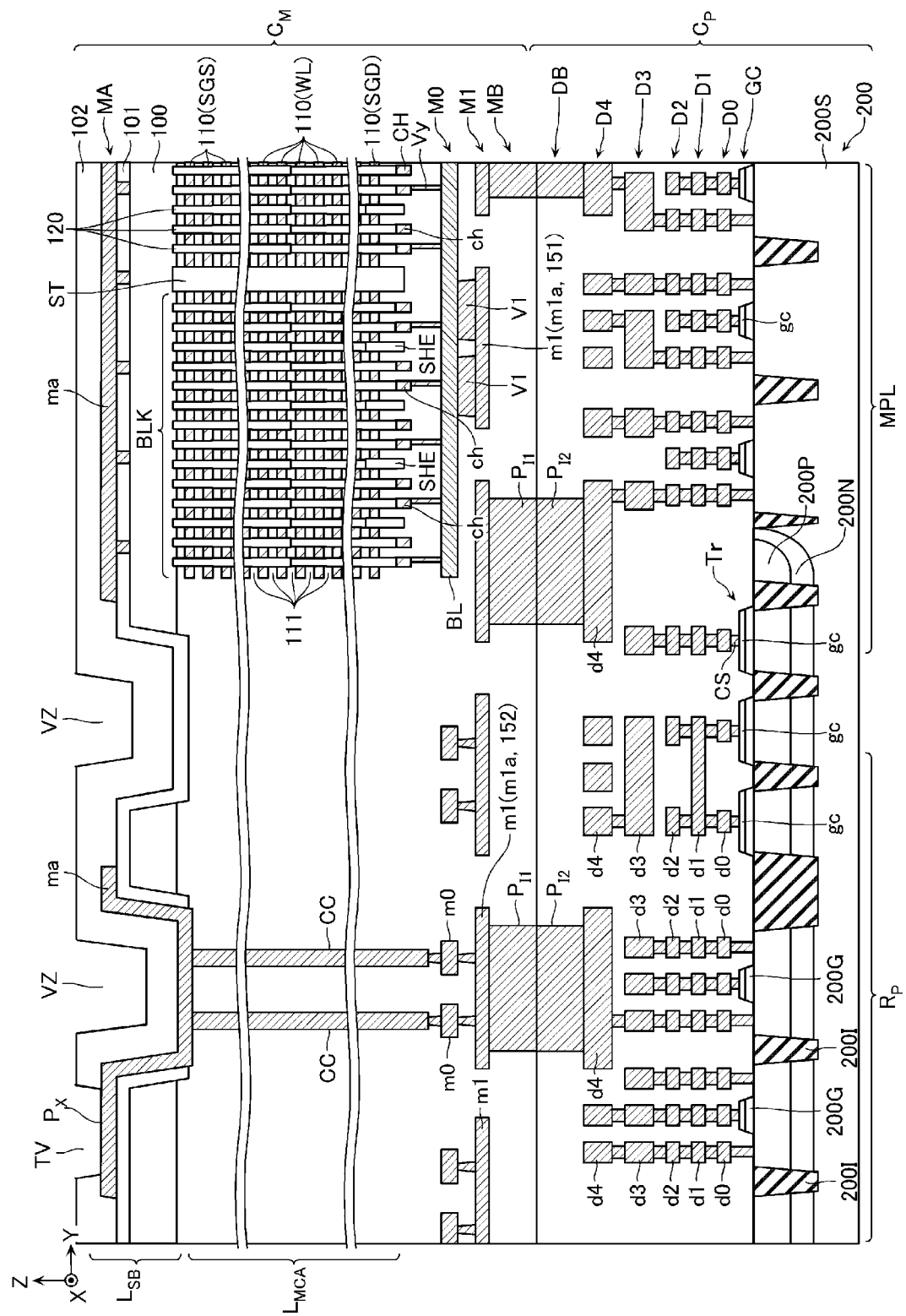
FIG. 14 is a cross-sectional diagram schematically showing a configuration of a part of the memory die MD.
Figure 15:
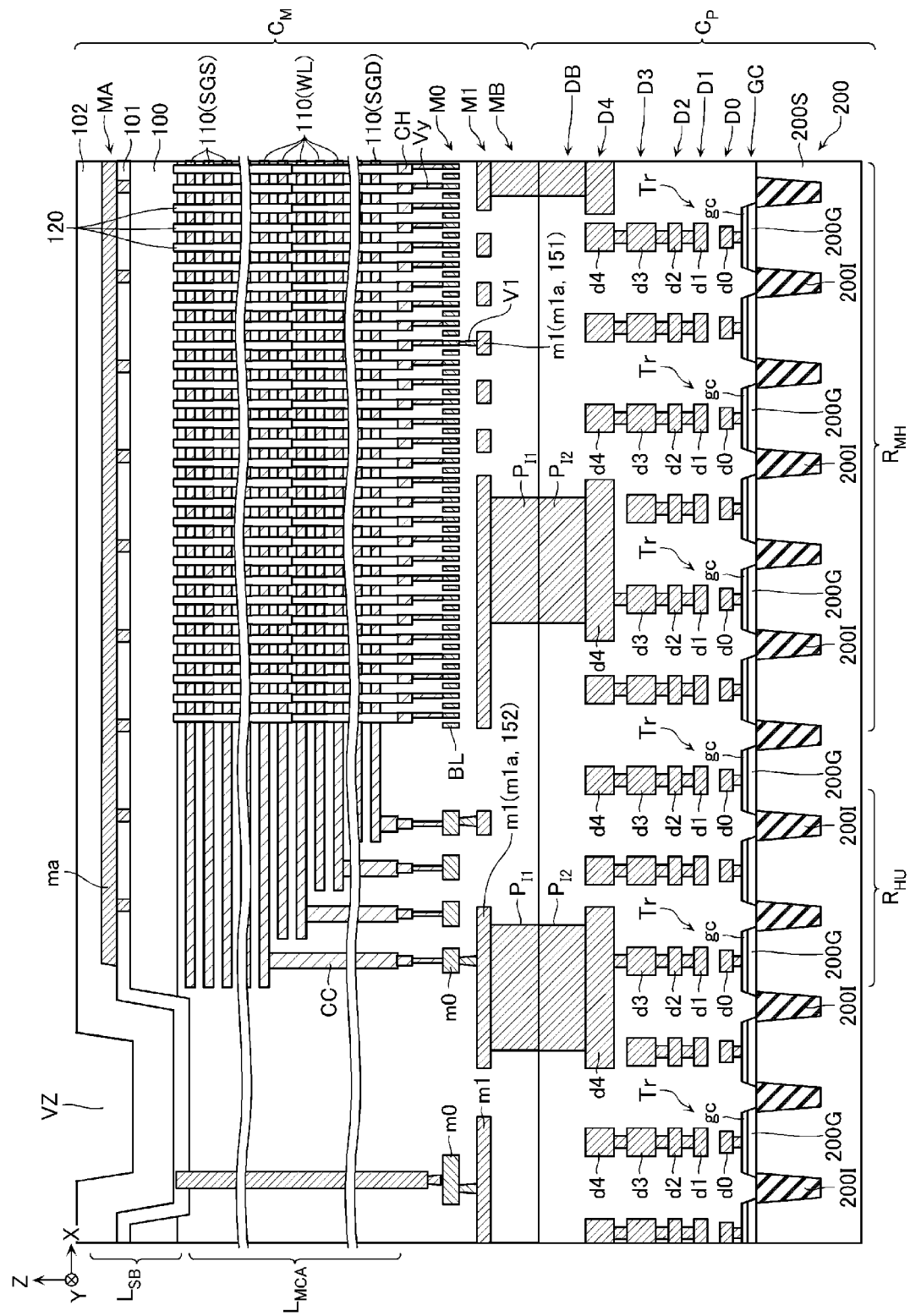
FIG. 15 is a cross-sectional diagram schematically showing a configuration of another part of the memory die MD.
Figure 16:
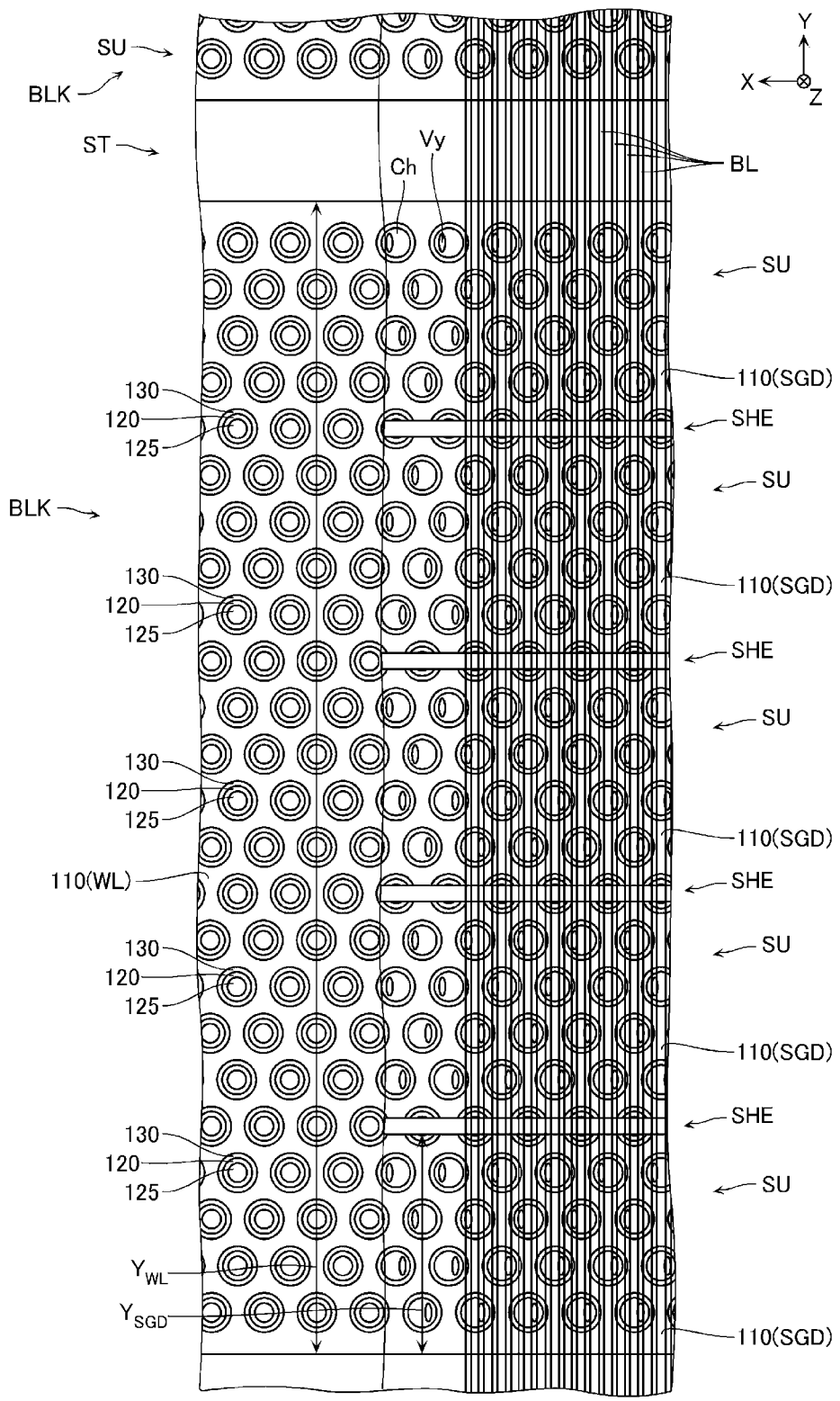
FIG. 16 is a bottom view diagram schematically showing a configuration of a part of the chip $C_M$.
Figure 17:
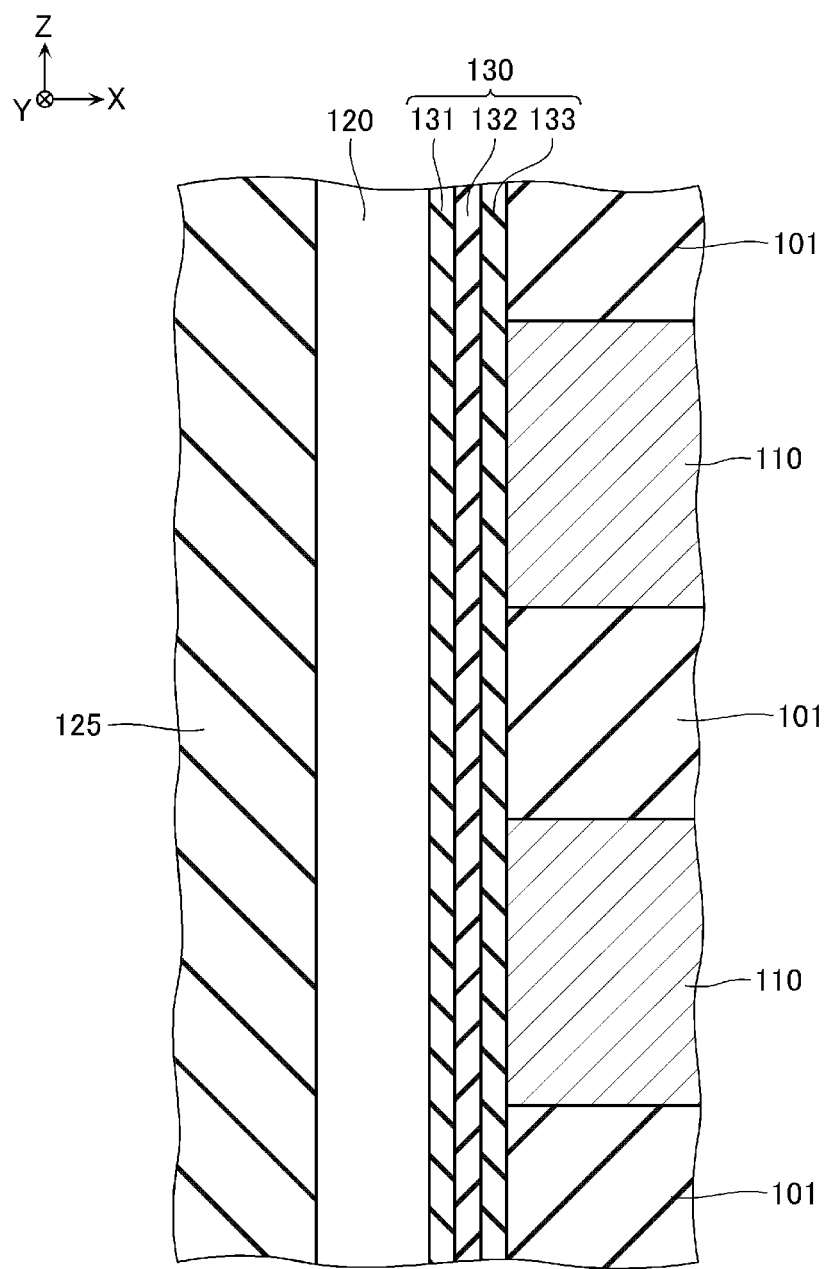
FIG. 17 is a cross-sectional diagram schematically showing a configuration of a part of the chip $C_M$.

FIG. 13 is a bottom view diagram schematically showing an example of the configuration of the chip C$_M$. In FIG. 13, the configuration of a part of the bonding electrode P$_{I1}$ or the like is omitted. FIGS. 14 and 15 are cross-sectional diagrams schematically showing the configuration of a part of the memory die MD. FIG. 16 is a bottom view diagram schematically showing the configuration of a part of the chip C$_M$. FIG. 17 is a cross sectional diagram schematically showing the configuration of a part of the chip C$_M$. FIG. 17 shows a YZ cross section, but when the cross section (for example, XZ cross section) other than the YZ cross section along the center axis of a semiconductor layer 120 is observed, the same structure as FIG. 17 is observed.

Structure of Chip $C_M$

In the example shown in FIG. 13, the chip $C_M$ includes four memory planes MPL0, MPL1, MPL2, and MPL3 arranged in the X direction. The four memory planes MPL0 to MPL3 correspond to one memory cell array MCA (FIG. 5), respectively. Also, each of the four memory planes MPL0 to MPL3 includes the plurality of memory blocks BLK arranged in the Y direction. In the example shown in FIG. 13, the plurality of memory blocks BLK include a hook-up region Rau provided at both end parts in the X direction and a memory hole region RMs provided therebetween. Further, the chip $C_M$ includes a peripheral region $R_P$ provided on one end side of the four memory planes MPL0 to MPL3 in the Y direction.

In the illustrated example, the hook-up region $R_{HU}$ is provided at both end parts of a memory cell array region $R_{MCA}$ in the X direction. However, such a configuration is only an example, and the specific configuration may be modified appropriately. For example, the hook-up region Rau may be provided at one end part of the memory cell array region $R_{MCA}$ in the X direction, not both end parts in the X direction. Also, the hook-up region $R_{HU}$ may be provided at a central position or a position near the center of the memory cell array region $R_{MCA}$ in the X direction.

For example, as shown in FIG. 14, the chip $C_M$ includes a base layer $L_{SB}$, a memory cell array layer $L_{MCA}$ provided below the base layer $L_{SB}$, and a plurality of wiring layers CH, M0, M1, and MB provided below the memory cell array layer $L_{MCA}$.

Structure of Base Layer $L_{SB}$ of Chip $C_M$

As shown in FIG. 14, the Base layer $L_{SB}$ includes a conductive layer 100 provided on the upper surface of the memory cell array layer $L_{MCA}$, an insulating layer 101 provided on the upper surface of the conductive layer 100, a back surface wiring layer MA provided on the upper surface of the insulating layer 101, and an insulating layer 102 provided on the upper surface of the back surface wiring layer MA.

For example, the conductive layer 100 may contain a semiconductor layer such as silicon (Si) injected with an N-type impurity such as phosphorus (P) or a P-type impurity such as boron (B), and may contain metals such as tungsten (W) or silicide such as tungsten silicide (WSi).

The conductive layer 100 functions as a part of the source line SL (FIG. 5). Four conductive layers 100 are provided corresponding to the four memory planes MPL0 to MPL3, respectively (FIG. 13). A region VZ not including the conductive layer 100 is provided at the end parts of the memory planes MPL0 to MPL3 in the X and Y directions.

The insulating layer 101 includes, for example, silicon oxide ($SiO_2$).

The back surface wiring layer MA includes a plurality of wirings ma. For example, the plurality of wirings ma may contain aluminum (Al) or the like.

A part of the plurality of wirings ma functions as a part of the source line SL (FIG. 5). Four wirings ma are provided corresponding to the four memory planes MPL0 to MPL3 (FIG. 13). Each of the wirings ma is electrically connected to the conductive layer 100.

A part of the plurality of wirings ma functions as the pad electrode Px. The wirings ma are provided in the peripheral region $R_P$. The wirings ma are connected to a via contact electrode CC in the memory cell array layer $L_{MCA}$ in the region VZ not including the conductive layer 100. A part of the wirings ma is exposed to the outside of the memory die MD through an opening TV provided in the insulating layer 102.

The insulating layer 102 is, for example, a passivation layer made of an insulating material such as polyimide.

Structure in Memory Hole Region $R_{MH}$ of Memory Cell Array Layer $L_{MCA}$ Of Chip $C_M$ As described with reference to FIG. 13, the plurality of memory blocks BLK arranged in the Y direction are provided in the memory cell array layer $L_{MCA}$. As shown in FIG. 14, an inter-block insulating layer ST such as silicon oxide ($SiO_2$) is provided between two memory blocks BLK adjacent in the Y direction.

For example, as shown in FIG. 14, the memory block BLK includes a plurality of conductive layers 110 arranged in the Z direction and a plurality of semiconductor layers 120 each extending in the Z direction. A gate insulating film 130 is provided between the plurality of conductive layers 110 and the plurality of semiconductor layers 120 as shown in FIG. 17.

The conductive layer 110 has a substantially plate-like shape extending in the X direction. The conductive layer 110 may contain a stacked film of a barrier conductive film such as titanium nitride (TiN) and a metal film such as tungsten (W) and the like. For example, the conductive layer 110 may contain polycrystalline silicon or the like containing impurities such as phosphorus (P) or boron (B). An interlayer insulating layer 111 such as silicon oxide ($SiO_2$) is provided between the plurality of conductive layers 110 located in the Z direction.

Among the plurality of conductive layers 110, one or more conductive layers 110 located at the top layer function as gate electrodes of source-side select transistors STS (FIG. 5) and source-side select gate lines SGS (FIG. 14). The plurality of conductive layers 110 are electrically independent for each memory block BLK.

The plurality of conductive layers 110 located therebelow function as gate electrodes and word lines WL of the memory cell MC (FIG. 5). Each of the plurality of conductive layers 110 is electrically independent for each memory block BLK.

Further, one or more conductive layers 110 located therebelow function as gate electrodes of drain-side select transistors STD and drain-side select gate lines SGD. For example, as shown in FIG. 16, a width $Y_{SGD}$ of the plurality of conductive layers 110 in the Y direction is less than a width $Y_{WL}$ of the conductive layers 110 functioning as word lines WL in the Y direction. An insulating layer SHE such as silicon oxide ($SiO_2$) is provided between two conductive layers 110 adjacent in the Y direction.

For example, the semiconductor layers 120 are located in a predetermined pattern in the X and Y directions as shown in FIG. 16. Each of the semiconductor layer 120 functions as a channel region of the plurality of memory cells MC and select transistors (STD and STS) provided in one memory string MS (FIG. 12). The semiconductor layer 120 includes, for example, polycrystalline silicon (Si). The semiconductor layer 120 has a substantially cylindrical shape, and an insulating layer 125 such as silicon oxide is provided at the center part. The outer peripheral surface of the semiconductor layer 120 is surrounded by the plurality of conductive layers 110, and is opposed to the plurality of conductive layers 110.

An impurity region not shown is provided at the upper end of the semiconductor layer 120. The impurity region is connected to the conductive layer 100 (see FIG. 14). For example, the impurity region contains an N-type impurity such as phosphorus (P) or a P-type impurity such as boron (B).

An impurity region not shown is provided at the lower end of the semiconductor layer 120. The impurity region is connected to a bit line BL via a via contact electrode ch and a via contact electrode Vy. For example, the impurity region contains an N-type impurity such as phosphorus (P).

For example, the gate insulating film 130 has a substantially cylindrical shape covering the outer peripheral surface of the semiconductor layer 120 as shown in FIG. 16. For example, as shown in FIG. 17, the gate insulating film 130 includes a tunnel insulating film 131, a charge storage film 132, and a block insulating film 133 stacked between the semiconductor layer 120 and the conductive layer 110. The tunnel insulating film 131 and the block insulating film 133 include, for example, silicon oxide ($SiO_2$). The charge storage film 132 includes, for example, a film capable of storing charge such as silicon nitride (SiN). The tunnel insulating film 131, the charge storage film 132, and the block insulating film 133 have substantially cylindrical shapes and extend in the Z direction along the outer peripheral surface of the semiconductor layer 120 except a contact part between the semiconductor layer 120 and the conductive layer 100.

FIG. 17 shows an example in which the gate insulating film 130 includes the charge storage film 132 such as silicon nitride. Alternatively, the gate insulating film 130 may include, for example, a floating gate such as polycrystalline silicon containing an N-type or P-type impurity.

Structure in Hook-Up Region $R_{HU}$ of Memory Cell Array Layer $L_{MCA}$ of Chip $C_M$ As shown in FIG. 15, a plurality of via contact electrodes CC are provided in the hook-up region $R_{HU}$. The plurality of via contact electrodes CC extend in the Z direction and are connected to the conductive layer 110 at the upper end, respectively.

Structure in Peripheral Region $R_P$ of Memory Cell Array Layer $L_{MCA}$ Of Chip $C_M$ For example, as shown in FIG. 14, the plurality of via contact electrodes CC corresponding to the pad electrodes Px are provided in the peripheral region $R_P$. The plurality of via contact electrodes CC are connected to the pad electrode Px at the upper end.

Structure of Wiring Layers CH, M0, M1, and MB of Chip $C_M$

A plurality of wirings provided in the wiring layers CH, M0, M1, and MB are electrically connected to at least one of the configuration in the memory cell array layer $L_{MCA}$ and the configuration in the chip $C_P$, for example.

The wiring layer CH includes a plurality of via contact electrodes ch as a plurality of wirings. For example, the plurality of via contact electrodes ch may contain a stacked film of a barrier conductive film such as titanium nitride (TiN) and a metal film such as tungsten (W) and the like. The via contact electrodes ch are provided corresponding to the plurality of semiconductor layers 120, and connected to the lower ends of the plurality of semiconductor layers 120.

The wiring layer M0 includes a plurality of wirings m0. For example, the plurality of wirings m0 may contain a stacked film of a barrier conductive film such as titanium nitride (TiN) and a metal film such as copper (Cu) and the like. A part of the plurality of wirings m0 functions as bit lines BL. The bit lines BL are located in the X direction and extend in the Y direction, for example, as shown in FIG. 16.

The wiring layer M1 contains a plurality of wirings m1, for example, as shown in FIG. 14. For example, the plurality of wirings m1 may contain a stacked film of barrier conductive film such as titanium nitride (TiN) and a metal film such as tungsten (W) and the like.

The wiring layer MB contains the plurality of bonding electrodes $P_{I1}$. For example, the plurality of bonding electrodes $P_{I1}$ may contain a stacked film of a barrier conductive film such as titanium nitride (TiN) and a metal film such as copper (Cu) and the like.

Structure of Chip $C_P$

For example, as shown in FIG. 14, the chip $C_P$ includes a semiconductor substrate 200, an electrode layer GC provided above the semiconductor substrate 200, and wiring layers D0, D1, D2, D3, D4, and DB provided above the electrode layer GC.

Structure of Semiconductor Substrate 200 of Chip $C_P$ For example, the semiconductor substrate 200 contains P-type silicon (Si) containing a P-type impurity such as boron (B). An N-type well region 200N containing an N-type impurity such as phosphorus (P), a P-type well region 200P containing a P-type impurity such as boron (B), a semiconductor substrate region 200S not having the N-type well region 200N and the P-type well region 200P, and an insulating region 200I are provided on the surface of the semiconductor substrate 200. The N-type well region 200N, the P-type well region 200P, and the semiconductor substrate region 200S function as a plurality of transistors Tr including the peripheral circuit PC, a part of a plurality of capacitors and the like, respectively.

Structure of Electrode Layer GC of Chip $C_P$

The electrode layer GC is provided via an insulating layer 200G on the upper surface of the semiconductor substrate 200. The electrode layer GC contains a plurality of electrodes gc facing the front surface of the semiconductor substrate 200. The plurality of electrodes gc contained in each region of the semiconductor substrate 200 and in the electrode layer GC are connected to a via contact electrode CS, respectively.

The N-type well region 200N, the P-type well region 200P, and the semiconductor substrate region 200S of the semiconductor substrate 200 function as channel regions of the plurality of transistors Tr including the peripheral circuit PC and one of electrodes or the like of a plurality of capacitors, respectively.

The plurality of electrodes gc contained in the electrode layer GC function as gate electrodes of a plurality of transistors Tr including the peripheral circuit PC and other electrodes of a plurality of capacitors, and the like.

The via contact electrode CS extends in the Z direction, is and connected to the upper surface of the semiconductor substrate 200 or the electrode gc at the lower end. An impurity region containing an N-type impurity or a P-type impurity is provided at a connection part between the via contact electrode CS and the semiconductor substrate 200. For example, the via contact electrode CS may contain a stacked film of a barrier conductive film such as titanium nitride (TiN) and a metal film such as tungsten (W) and the like.

Structure of Wiring Layers D0, D1, D2, D3, D4, and DB of Chip $C_P$

For example, as shown in FIG. 14, a plurality of wirings contained in the wiring layers D0, D1, D2, D3, D4, and DB are electrically connected to at least one of a component in the memory cell array layer $L_{MCA}$ and a component in the chip $C_P$.

Each of the wiring layers D0, D1, and D2 contains a plurality of wirings d0, d1, and d2. For example, the plurality of wirings d0, d1, and d2 may contain a stacked film of a barrier conductive film such as titanium nitride (TiN) and a metal film such as tungsten (W) and the like.

Each of the wiring layers D3 and D4 contains a plurality of wirings d3 and d4. For example, the plurality of wirings d3 and d4 may contain a stacked film of a barrier conductive film such as titanium nitride (TiN) and a metal film such as copper (Cu) and the like.

A wiring layer DB contains a plurality of bonding electrodes $P_{I2}$. For example, the plurality of bonding electrodes $P_{I2}$ may contain a stacked film of a barrier conductive film such as titanium nitride (TiN) and a metal film such as copper (Cu) and the like.

Threshold Voltage of Memory Cell MC

Figures 18A, 18B:
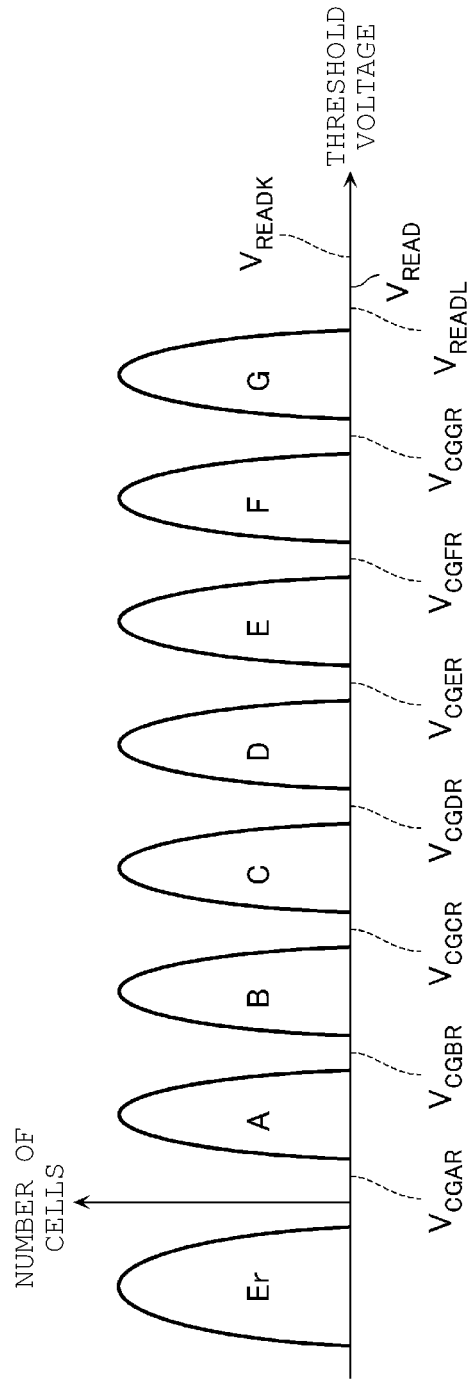
FIGS. 18A and 18B are diagrams schematically illustrating data stored in a memory cell MC.

Next, the threshold voltage of the memory cell MC is described by referring to FIGS. 18A and 18B. FIG. 18A is a histogram schematically illustrating the threshold voltages of the memory cells MC. The horizontal axis indicates the voltage of the word line WL, and the vertical axis indicates the number of memory cells MC. FIG. 18B is an example of the threshold voltages of the memory cells MC and values of data stored in the memory cells MC.

As described above, the memory cell array MCA includes a plurality of memory cells MC. If a write operation is performed on the plurality of memory cells MC, the threshold voltage of the memory cells MC is controlled to one of a plurality of states. FIG. 18A shows the distribution of the threshold voltages of the memory cells MC controlled to eight different states. For example, the threshold voltage of the memory cell MC controlled to A state is larger than a read voltage $V_{CGAR}$ in FIG. 18A and smaller than a read voltage $V_{CGBR}$. The threshold voltages of all memory cells MC are smaller than a plurality of read path voltages $V_{READ}$, $V_{READK}$, and $V_{READL}$ in FIG. 18A.

Figure 21:
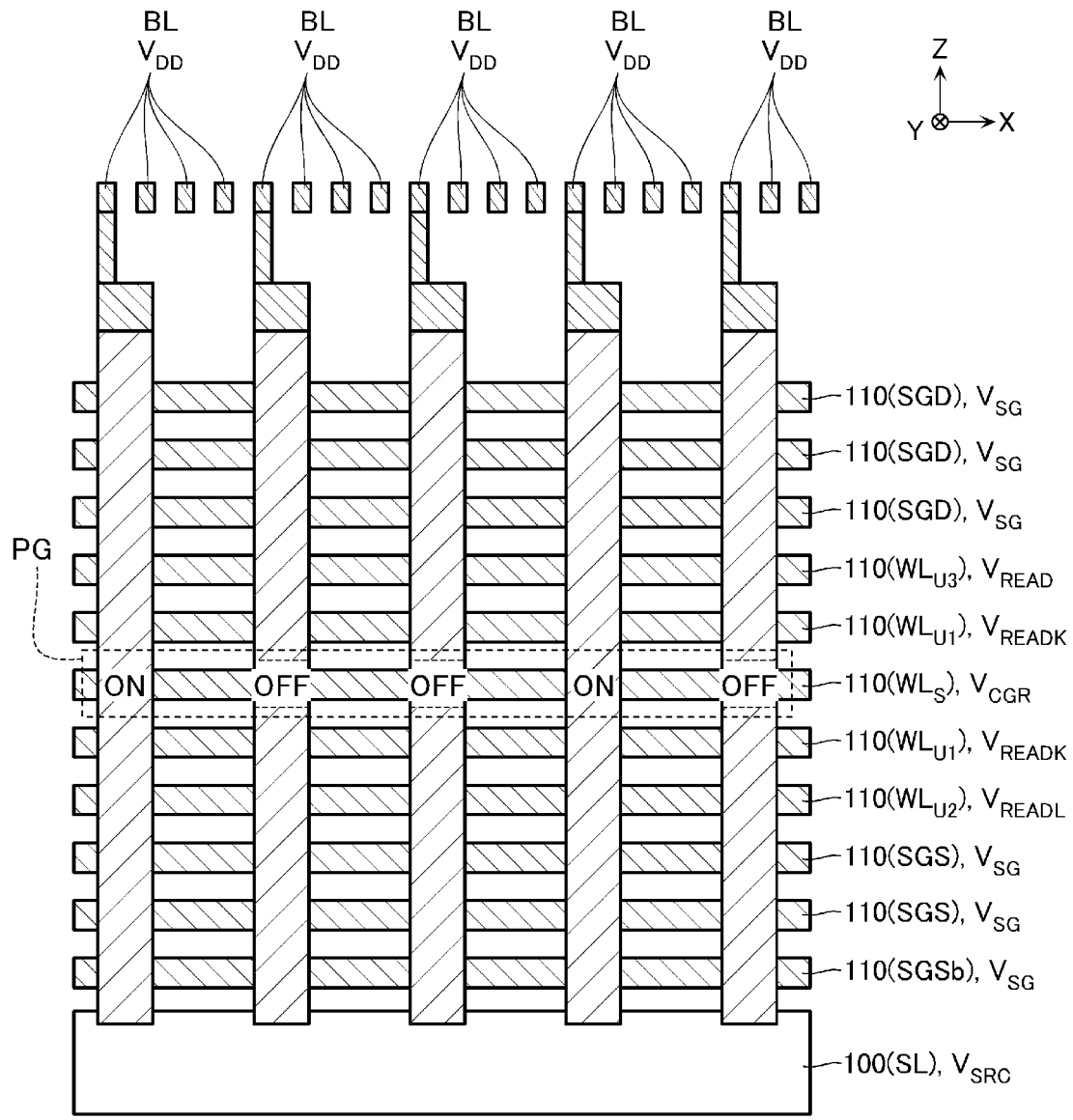
FIG. 21 is a cross sectional diagram to explain a read voltage supply operation.

The plurality of read path voltages $V_{READ}$, $V_{READK}$, and $V_{READL}$ are voltages with a plurality of voltage values applied to the non-selected word line $WL_U$ when a read operation is executed (see FIG. 21). In the example of FIG. 18A, the read path voltage $V_{READK}$ is larger than the read path voltage $V_{READ}$ and the read path voltage $V_{READ}$ is larger than the read path voltage $V_{READL}$. However, the magnitude relationship of the voltage values of the read path voltages $V_{READ}$, $V_{READK}$, and $V_{READL}$ is one example and is not limited to such voltage values.

In the present embodiment, three bits of data are stored in each memory cell MC by controlling the memory cell MC to one of eight different states.

For example, Er state corresponds to the lowest threshold voltage (threshold voltage of the memory cell MC in an erased state). For example, data "111" is allocated to a memory cell MC corresponding to Er state.

Also, A state corresponds to a threshold voltage higher than the threshold voltage corresponding to Er state. For example, data "110" is allocated to a memory cell MC corresponding to A state.

Also, B state corresponds to a threshold voltage higher than the threshold voltage corresponding to A state. For example, data "100" is allocated to a memory cell MC corresponding to B state.

Similarly, C to G states in the drawing correspond to threshold voltages higher than the threshold voltages corresponding to B to F states. For example, data "000", "010", "011", "001", and "101" is allocated to memory cells MC corresponding to these distributions.

For the assignment shown in FIG. 18B, lower bit (LP: Lower Page) data can be determined by two read voltages $V_{CGAR}$ and $V_{CGER}$, middle bit (MP: Middle Page) data can be determined by three read voltages $V_{CGBR}$, $V_{CGDR}$, and $V_{CGFR}$, and an upper bit (UP: Upper Page) can be determined by two read voltages $V_{CGCR}$ and $V_{CGGR}$. Such allocation of data may be referred to as 2-3-2 code.

Further, the number of bits of data to be stored in the memory cell MC, the number of states, the allocation of data to each state, and the like, can be appropriately changed.

Types of Modes of Read Operation

Next, the types of modes of a read operation according to the present embodiment are described. The types of modes of a read operation according to the present embodiment include a normal read mode, a cache read mode, and a connection read mode.

Normal Read Mode

A normal read mode is a mode for executing a normal read. In a normal read, when the ready/busy signal RB is controlled to "H" state (ready state), if a command set for instructing a normal read (see command set $CS_{R3}$ in FIG. 30 to be described later) is input from the controller die CD, a read operation is started and the ready/busy signal RB is controlled to "L" state (busy state).

At the end of the read operation of the normal read, the ready/busy signal RB is controlled from "L" state (busy state) to "H" state (ready state), and a command set for instructing the normal read is made acceptable. In the normal read mode, the state of the ready/busy signal RB matches "True busy". The "True busy" indicates a state in which access to the sense amplifier module SAM is prohibited or a write operation, a read operation, an erasing operation, and the like are being executed on the memory cell array MCA.

Cache Read Mode

A cache read mode is a mode for executing a cache read. In a cache read, when the ready/busy signal RB is controlled to "H" state (ready state), if a command set for instructing a cache read (see command set $CS_{R1}$ in FIG. 19) is accepted, a read operation is started, and the ready/busy signal RB is temporarily controlled from "H" state (ready state) to "L" state (busy state) and immediately controlled from "L" state (busy state) to "H" state (ready state). By changing the ready/busy signal RB in the order of "H" state, "L" state, and "H" state, the controller die CD is notified that the memory die MD is in the cache read mode.

If the ready/busy signal RB is controlled to "H" state (ready state), even if the read operation of the cache read is not finished, a command set for instructing the cache read as a next read operation can be accepted. If the cache read continues, an (i+1)-th cache read is started after the i-th (for example, i is an integer of 1 or more) cache read is finished. In such a case, after a command set for instructing the (i+1)-th cache read is received, the ready/busy signal RB changes from "H" state (ready state) to "L" state (busy state). The ready/busy signal RB returns to "H" state (ready state) when the (i+1)-th cache read is started. In the cache read mode, the ready/busy signal RB state does not match "True busy".

Connection Read Mode

A connection read mode is a mode for executing a connection read. A semiconductor memory device according to the present embodiment is configured to operate in a connection read mode in addition to a normal read mode and a cache read mode. The connection read is basically executed in the similar manner as the cache read. However, in the connection read, not only when the ready/busy signal RB is controlled to "H" state (ready state), but also when the ready/busy signal RB is controlled to "L" state (busy state), a command set for instructing the connection read (see command set $CS_{R2}$ in FIG. 20 and command set $CS_{R4}$ in FIG. 30) may be accepted. Also, when the connection read is continuous, the i-th (for example, i is an integer of 1 or more) read operation and an (i+1)-th read operation are continuously executed without interruption (see FIG. 24).

Command Set for Read Operation

Figure 19:
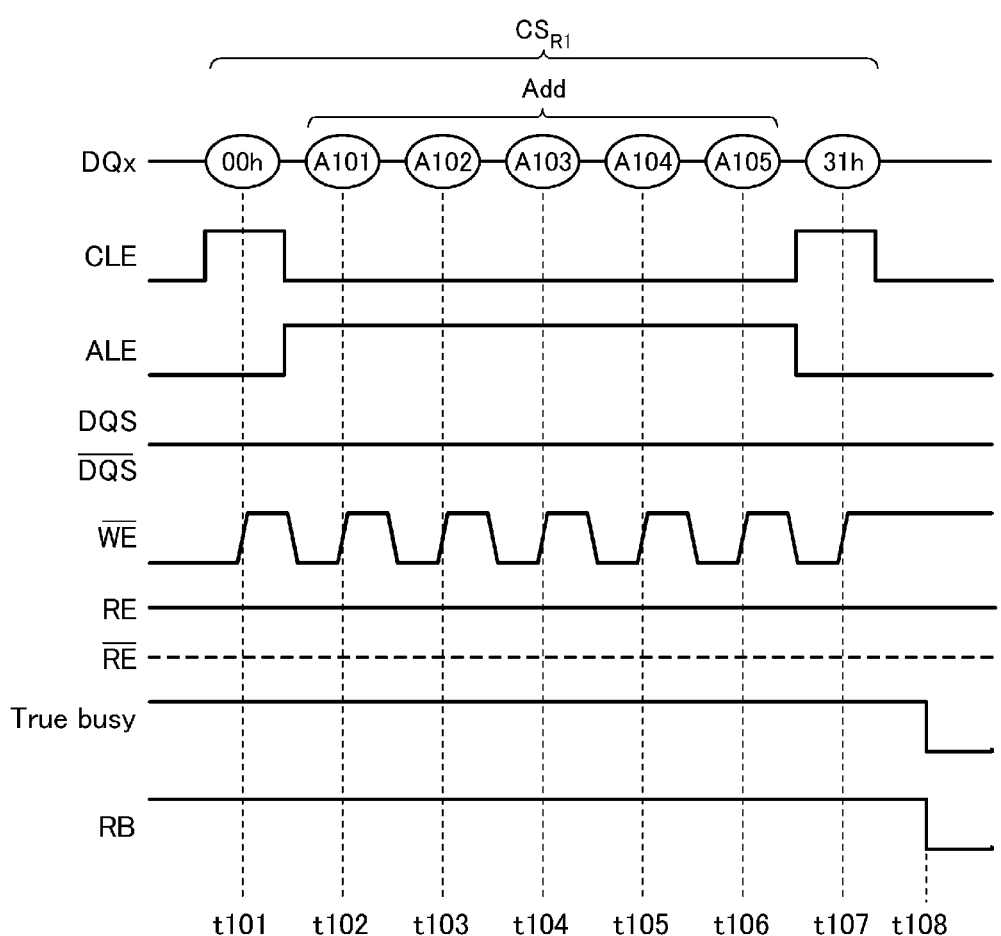
FIG. 19 is a timing chart illustrating an operation when a command set $CS_{R1}$ is received.
Figure 20:
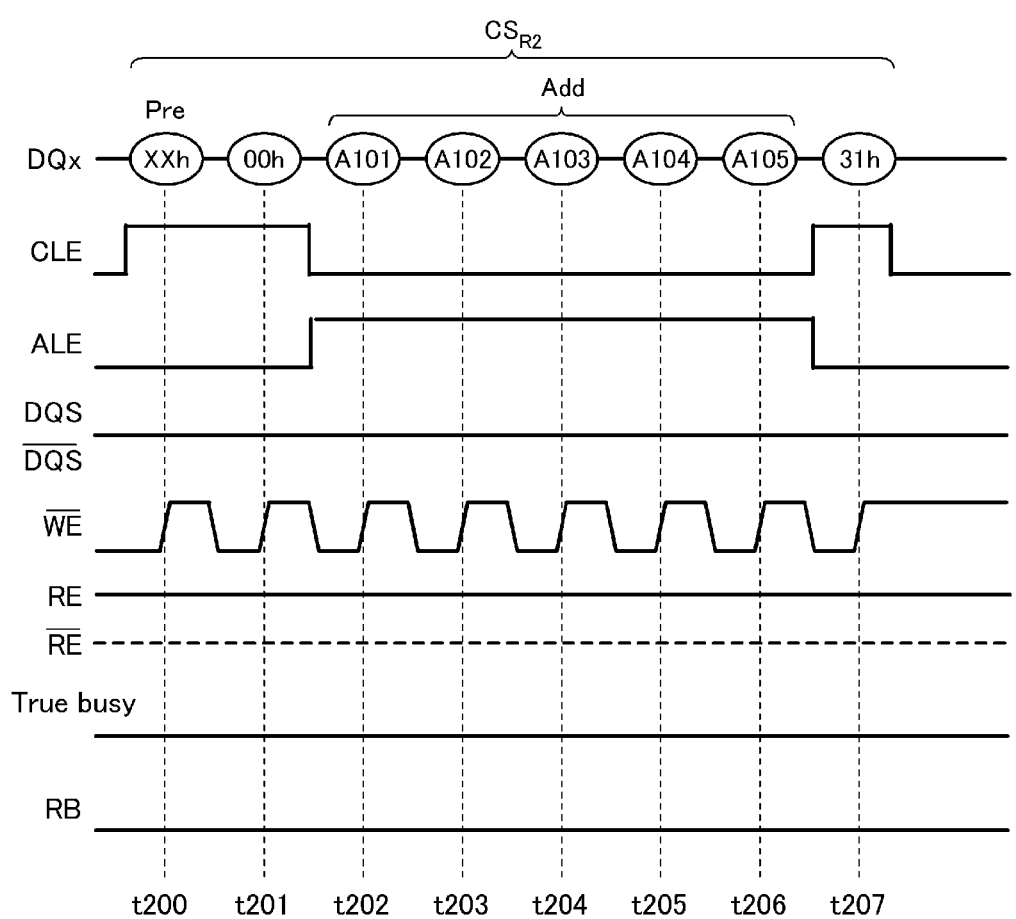
FIG. 20 is a timing chart illustrating an operation when a command set $CS_{R2}$ is received.

Next, an operation when receiving a command set for a read operation is described. FIG. 19 is a timing chart illustrating an operation when the command set $CS_{R1}$ is received. FIG. 20 is a timing chart illustrating an operation when the command set $CS_{R2}$ is received.

In the following description, eight bits of data input to eight data signal input/output terminals DQ0 to DQ7 may be expressed by using two hexadecimal digits. For example, when "0, 0, 0, 0, 0, 0, 0, 0" is input to eight data signal input/output terminals DQ0 to DQ7, the data may be expressed as data 00h or the like. Also, when "1,1,1,1,1,1,1,1" is input, the data may be expressed as data FFh or the like.

Operation when Command Set $CS_{R1}$ is Received

The command set $CS_{R1}$ input to the memory die MD for the cache read is illustrated in FIG. 19. An operation corresponding to the command set $CS_{R1}$ may be referred to as a "first read operation". As described below, the first read operation includes a first read path voltage supply operation, a first read voltage supply operation, and the second read path voltage supply operation. The command set $CS_{R1}$ is a command set for instructing the cache read. In the present embodiment, however, the command set $CS_{R1}$ is input to the memory die MD not only for the cache read but also for the connection read (see FIG. 23).

The command set $CS_{R1}$ includes data 00h, A101, A102, A103, A104, A105, and 31h. Among the data provided in the command set $CS_{R1}$, the parts of the data A101, A102, A103, A104, and A105 may be referred to as data Add. The data Add is data to be input to the address register ADR.

At timing t101, the controller die CD inputs data 00h to the memory die MD as command data $D_{CMD}$ (FIG. 4). In other words, the voltages of the data signal input/output terminals DQ0 to DQ7 are set to "H" or "L" according to each bit of data 00h, "H" is input to the external control terminal CLE, and "L" is input to the external control terminal ALE. In this state, the external control terminal/WE is raised from "L" to "H". The data 00h is a command input at the start of a read operation.

At timing t102, the controller die CD inputs data A101 to the memory die MD as address data $D_{ADD}$ (FIG. 4). In other words, the voltages of the data signal input/output terminals DQ0 to DQ7 are set to "H" or "L" according to each bit of data A101, "L" is input to the external control terminal CLE, and "H" is input to the external control terminal ALE. In this state, the external control terminal/WE is raised from "L" to "H". The data A101 is a part of the column address CA.

At timing t103, the controller die CD inputs data A102 to the memory die MD as address data $D_{ADD}$ (FIG. 4). The data A102 is a part of the column address CA.

At timing t104, the controller die CD inputs data A103 to the memory die MD as address data $D_{ADD}$ (FIG. 4). The data A103 is a part of the row address RA. The data A103 includes, for example, a block address and a page address. The block address is data specifying a memory block BLK. The page address is data specifying a string unit SU and a word line WL.

At timing t105, the controller die CD inputs data A104 to the memory die MD as address data $D_{ADD}$ (FIG. 4). The data A104 is a part of the row address RA. The data A104 includes, for example, a block address and a page address.

At timing t106, the controller die CD inputs data A105 to the memory die MD as address data $D_{ADD}$ (FIG. 4). The data A105 includes a chip address and a plane address. The chip address is data specifying one memory die MD from the plurality of memory dies MD controlled by the controller die CD. The plane address is data specifying one memory plane from a plurality of memory planes MPL0 to MPL3 controlled by the controller die CD.

At timing t107, the controller die CD inputs data 31h to the memory die MD as command data $D_{CMD}$ (FIG. 4). The data 31h is a command indicating that the input of the command set $CS_{R1}$ related to a read operation is finished.

At timing t108, the voltage (ready/busy signal RB) of the terminal RBn goes from "H" state to "L" state, and access to the memory die MD is prohibited. Also, a read operation is executed in the memory die MD.

Operation when Command Set $CS_{R2}$ is Received

The command set $CS_{R2}$ input to the memory die MD for the connection read is illustrated in FIG. 20. An operation corresponding to the command set $CS_{R2}$ may be referred to as a "second read operation". The second read operation includes a second read voltage supply operation and a third read path voltage supply operation. The command set $CS_{R2}$ is a command set for instructing the connection read. The command set $CS_{R2}$ includes data XXh, 00h, A101, A102, A103, A104, A105, and 31h. A part other than the data XXh in the command set $CS_{R2}$ is the same as the command set $CS_{R1}$. In other words, the command set in which data XXh is added to the head of the command set $CS_{R1}$ is the command set $CS_{R2}$. The data XXh is a prefix command. In FIG. 20, the prefix command is described as "Pre".

In addition, the 8-bit data including the data XXh may be either "0" or "1", respectively. Data from the first bit to the fourth bit and data from the fifth bit to the eighth bit of 8-bit data including the data XXh may match or may be different from each other.

In the examples in FIGS. 19 and 20, data Add in the command set $CS_{R1}$ and the command set $CS_{R2}$ are all data A101, A102, A103, A104, and A105. However, this data Add may not mean the same address, but may be a different address.

At timing t200, the controller die CD inputs data XXh to the memory die MD as command data $D_{CMD}$ (FIG. 4). In other words, the voltages of the data signal input/output terminals DQ0 to DQ7 are set to "H" or "L" according to each bit of data XXh, "H" is input to the external control terminal CLE, and "L" is input to the external control terminal ALE. In this state, the external control terminal /WE is raised from "L" to "H". The data XXh is a command for notifying the memory die MD of the connection read.

Data A101, A102, A103, A104, A105, and 31h in timing t201 to timing t207 are received in the same way as the operation in timing t101 to timing t107 illustrated in FIG. 19. Accordingly, duplicate description are omitted.

Read Voltage Supply Operation

Next, the read voltage supply operation (first read voltage supply operation and second read voltage supply operation) of the normal read, the cache read and the connection read are described.

FIG. 21 is a cross sectional diagram to explain the read voltage supply operation. In addition, the read voltage supply operation described below is common in any cases of the normal read, the cache read, and the connection read.

In the following description, word lines WL to be operated may be referred to as selected word lines $WL_S$, and other word lines WL may be referred to as non-selected word lines $WL_U$. Also, in the following description, an example of executing a read voltage supply operation on a memory cell MC connected to a selected word line $WL_S$ (hereinafter, may be referred to as a "selected memory cell MC") among the plurality of memory cells MC provided in the string unit SU, which are a target of an operation is described. In the following description, a configuration including the plurality of selected memory cells MC may be referred to as selected page PG.

In a read voltage supply operation, for example, the voltage $V_{DD}$ is supplied to a bit line BL. For example, "H" is latched to the latch circuit DL0 in FIG. 11, and the states of signal lines STB, XXL, BLC, BLS, HLL, and BLX are set to "L, L, H, H, H, H". Consequently, the voltage $V_{DD}$ is supplied to the bit line BL and the sense node SEN. A voltage $V_{SRC}$ is supplied to the source line SL. Th voltage $V_{SRC}$ may be greater than the ground voltage $V_{SS}$ or equal to the ground voltage $V_{SS}$. The voltage $V_{DD}$ is greater than the voltage $V_{SRC}$.

In the read voltage supply operation, the voltage $V_{SG}$ is supplied to the drain-side select gate line SGD. The voltage $V_{SG}$ is greater than voltage $V_{DD}$. A voltage difference between the voltage $V_{SG}$ and the voltage $V_{DD}$ is larger than a threshold voltage of the drain-side select transistor STD. As a result, an electron channel is formed in the channel region of the drain-side select transistor STD, and a voltage $V_{DD}$ is transferred.

In the read voltage supply operation, the voltage $V_{SG}$ is supplied to the source-side select gate lines SGS and SGSb. The voltage $V_{SG}$ is greater than the voltage $V_{SRC}$. A voltage difference between the voltage $V_{SG}$ and the voltage $V_{SRC}$ is larger than a threshold voltage of the source-side select transistors STS and STSb. As a result, an electron channel is formed in the channel regions of the source-side select transistors STS and STSb, and a voltage $V_{SRC}$ is transferred.

In the read voltage supply operation, a read path voltage $V_{READK}$ is supplied to two non-selected word lines $W_{LU}$ (hereinafter, referred to as non-selected word line $WL_{U1}$) adjacent to a selected word line $WL_S$ in the Z direction. A read path voltage $V_{READL}$ is supplied to a non-selected word line $WL_U$ (hereinafter, referred to as non-selected word line $WL_{U2}$) closer to the source line SL than the non-selected word line $WL_{U1}$. A read path voltage $V_{READ}$ is supplied to a non-selected word line $WL_U$ (hereinafter, referred to as non-selected word line $WL_{U3}$) closer to the bit line BL than the non-selected word line $WL_{U1}$. The read path voltages $V_{READ}$, $V_{READK}$, and $V_{READL}$ are all larger than the voltages $V_{DD}$ and $V_{SRC}$. A voltage difference between the read path voltages $V_{READ}$, $V_{READK}$, and $V_{READL}$, and the voltages $V_{DD}$ and $V_{SRC}$ is larger than a threshold voltage of the memory cell MC regardless of data stored in the memory cell MC. As a result, an electron channel is formed in the channel region of the non-selected memory cell MC, and voltages $V_{DD}$ and $V_{SRC}$ are transferred to the selected memory cell MC.

In the read voltage supply operation, a read voltage $V_{CGR}$ is supplied to a selected word line $WL_S$. The read voltage $V_{CGR}$ is smaller than the read path voltages $V_{READ}$, $V_{READK}$, and $V_{READL}$. The read voltage $V_{CGR}$ is any of the read voltages $V_{CGAR}$ to $V_{CGGR}$ described with reference to FIG. 18. A voltage difference between the read voltage $V_{CGR}$ and the voltage $V_{SRC}$ is larger than a threshold voltage of the memory cell MC in which some data are stored. As a result, the memory cell MC in which a part of the data is stored goes to ON state. Accordingly, a current flows through the bit line BL connected to such a memory cell MC. A voltage difference between the read voltage $V_{CGR}$ and the voltage $V_{SRC}$ is smaller than a threshold voltage of the memory cell MC in which some data are stored. As a result, the memory cell MC in which a part of data is stored goes to OFF state.

Consequently, no current flows through the bit line BL connected to the memory cell MC.

In the read voltage supply operation, the sense amplifier SA (see FIG. 11) detects a current flow in the bit line BL, thereby detecting the ON/OFF state of a memory cell MC. Hereafter, such an operation is referred to as "sensing operation". In a sensing operation, for example, in a state of supplying a voltage $V_{DD}$ to the bit line BL, the state of signal lines STB, XXL, BLC, BLS, HLL, and BLX is set to "L, H, H, H, L, L". Consequently, the sense node SEN of the sense amplifier SA conducts the bit line BL. After a fixed period, the states of the signal lines STB, XXL, BLC, BLS, HLL, and BLX are set to "L, L, H, H, L, L". Consequently, the sense node SEN of the sense amplifier SA is electrically separated from the bit line BL. After the execution of the sensing operation, the state of the signal line STB is temporarily set to "H". Consequently, the sense transistor 41 conducts the wiring LBUS (see FIG. 11), and the charge of the wiring LBUS is discharged or maintained. Further, any latch circuit in the sense amplifier unit SAU conducts the wiring LBUS, and the data of the wiring LBUS is latched by the latch circuit.

In the read voltage supply operation, arithmetic processing such as AND, OR, and the like is executed on data indicating the state of the memory cell MC as necessary, thereby determining the data stored in the memory cell MC. Also, this data is transferred to a latch circuit in the cache memory CM (see FIG. 4) via the wiring LBUS (see FIG. 11), the switch transistor DSW, and the wiring DBUS.

Read Operation of Cache Read

Next, the cache read is described.

Figure 22:
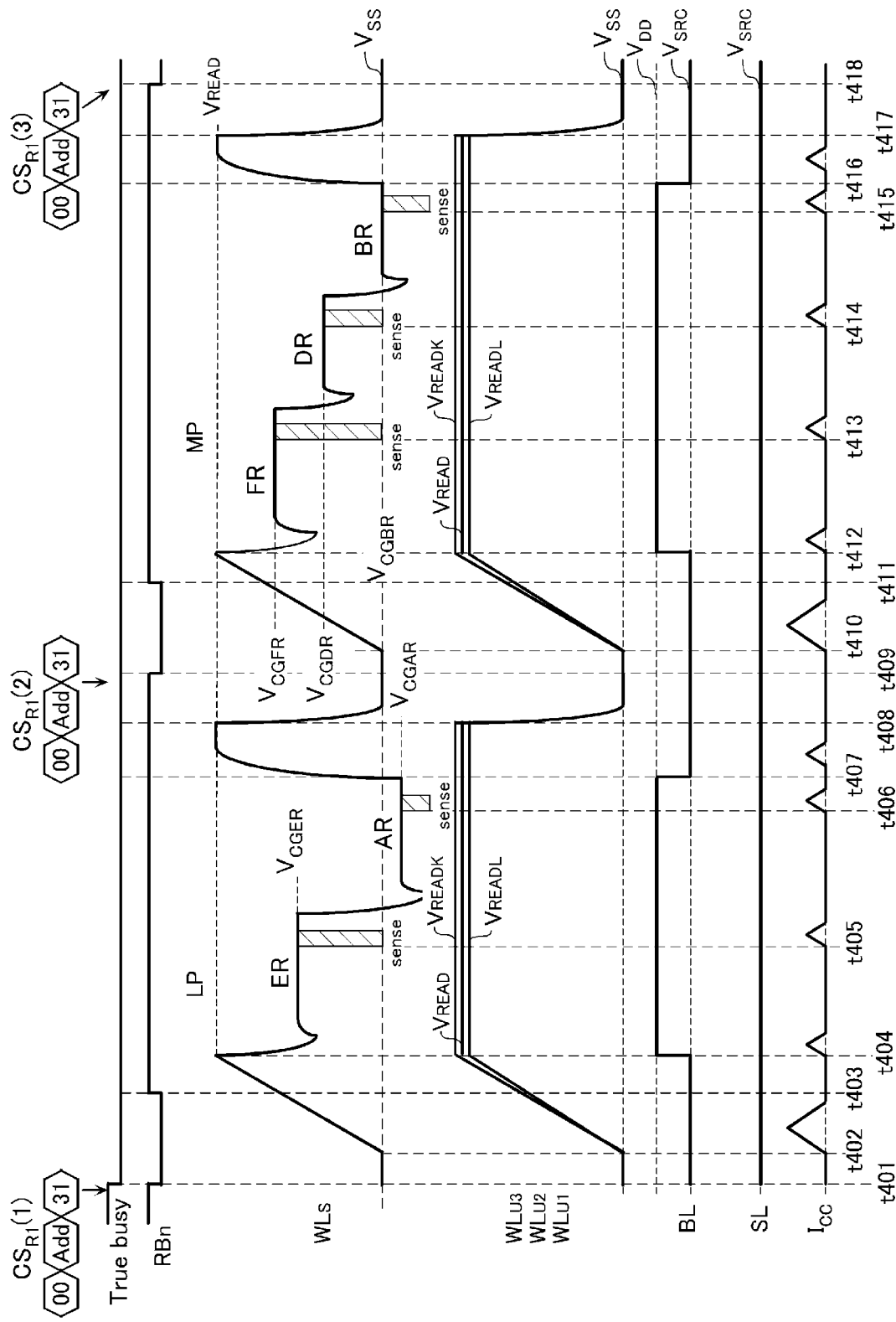
FIG. 22 is a timing chart illustrating a read operation of a cache read.

FIG. 22 is a timing chart illustrating the cache read. FIG. 23 is a diagram showing an example of command data $D_{CMD}$ and address data $D_{ADD}$ stored in the command register CMR and the address register ADR during the cache read. In the following description, the data is allocated to each memory cell MC in the manner illustrated with reference to FIG. 18B, and an example of reading the data of a lower page (LP) and a middle page (MP) is described.

At the time of starting the cache read, the controller die CD outputs a command set $CS_{R1}(1)$ for instructing the cache read to the memory die MD through the data signal input/output terminals DQ0 to DQ7. The command set $CS_{R1}(1)$ includes data 00h, Add, 31h as shown in FIG. 22. In order to distinguish a plurality of command sets $CS_{R1}$, a number is added to the command set $CS_{R1}$.

At timing t401, when the command set $CS_{R1}(1)$ is input, data 00h and 31h of the command set $CS_{R1}(1)$ is stored in the command register CMR as command data $D_{CMD}$, and data Add of the command set $CS_{R1}(1)$ is stored in the address register ADR as address data $D_{ADD}$ (see FIG. 23).

The sequencer SQC controls the terminal RBn (ready/busy signal RB) from "H" state to "L" state in response to an input of the command set $CS_{R1}(1)$. Accordingly, access to the memory die MD is prohibited. Also, a read operation is executed in the memory die MD. Also, when a read operation is started, "True busy" changes from "H" state to "L" state.

From timing t402 to timing t404, the voltage of a selected word line $WL_S$ provided in a selected memory block BLK is charged from the ground voltage $V_{SS}$ to the read path voltage $V_{READ}$. Furthermore, the voltages of non-selected word lines $WL_{U1}$, $WL_{U2}$, and $WL_{U3}$ provided in the selected memory block BLK are charged from the ground voltage $V_{SS}$ up to read path voltages $V_{READK}$, $V_{READL}$, and $V_{READ}$, respectively. A voltage $V_{SRC}$ is supplied to a bit line BL and a source line SL provided in the selected memory block BLK.

Here, when all word lines WL provided in the selected memory block BLK are charged to the plurality of read path voltages $V_{READK}$, $V_{READL}$, and $V_{READ}$, a positive charge is supplied to the charge pump circuit 32 functioning as the voltage generation unit vg2 (see FIG. 6) or supplying a voltage to the voltage generation unit vg2 (see FIG. 6). Consequently, an operating current $I_{CC}$ flowing to the pad electrode Px to which a power supply voltage $V_{CC}$ is supplied increases as shown in FIG. 22.

At timing t403, the sequencer SQC controls the terminal RBn from "L" state to "H" state. By changing the terminal RBn in the order of "H" state, "L" state, and "H" state, the controller die CD is notified that the memory die MD is in the cache read mode.

The operation from timing t402 to timing t404 in FIG. 22 corresponds to the first read path voltage supply operation.

At timing t404, the bit line BL is charged to the voltage $V_{DD}$. When charging the bit line BL to the voltage $V_{DD}$, a positive charge is supplied to the charge pump circuit 32 (not shown), which supplies a voltage to the bit line BL. Consequently, an operating current $I_{CC}$ flowing to the pad electrode Px to which a power supply voltage $V_{CC}$ is supplied increases as shown in FIG. 22.

Also, at timing t404, a voltage lower than the read voltage $V_{CGER}$ is supplied to a selected word line $WL_S$, and then the read voltage $V_{CGER}$ is supplied. Consequently, the memory cell MC corresponding to Er to D states in FIG. 18A goes to ON state, and the memory cell MC corresponding to E to G states goes to OFF state. Hereafter, the description "to supply the read voltage $V_{CGR}$ to a selected word line $WL_S$" means "to supply the read voltage $V_{CGR}$ to a selected word line $WL_S$ after supplying a voltage lower than the read voltage $V_{CGR}$.

At timing t405, a sensing operation ("sense" in FIG. 22) is executed. The sense amplifier SA acquires read data corresponding to the read voltage $V_{CGER}$. When executing a sensing operation, the amount of charge required for charging the sense node SEN or the like increases. The operating current $I_{CC}$ flowing through the pad electrode Px to which the power supply voltage $V_{CC}$ is supplied increases as shown in FIG. 22.

The read voltage $V_{CGAR}$ is then supplied to a selected word line $WL_S$. Consequently, the memory cell MC corresponding to Er state in FIG. 18A goes to ON state, and the memory cell MC corresponding to A to G states goes to OFF state.

At timing t406, a sensing operation is executed. The sense amplifier SA acquires read data corresponding to the read voltage $V_{CGAR}$. At this time, the operating current $I_{CC}$ flowing through the pad electrode Px to which the power supply voltage $V_{CC}$ is supplied increases as shown in FIG. 22.

The operation from timing t404 to timing t407 corresponds to the read voltage supply operation (first read voltage supply operation) described with reference to FIG. 21. As shown in FIGS. 21 and 22, a read path voltage $V_{READK}$ is supplied to the non-selected word line $WL_{U1}$ during the read voltage supply operation. A read path voltage $V_{READL}$ is supplied to the non-selected word line $WL_{U2}$. A read path voltage $V_{READ}$ is supplied to the non-selected word line $WL_{U3}$.

In a period from timing t407 to timing t408, the read path voltage $V_{READ}$ is supplied to a selected word line $WL_S$. The period from timing t407 to timing t408 is sometimes referred to as a channel clean period. A channel clean period is a period for raising a voltage lowered to the read voltage $V_{CGR}$ to the read path voltage $V_{READ}$ relative to the selected word line $WL_S$. In addition, in the channel clean period, the read path voltage $V_{READK}$ or $V_{READL}$ may be supplied to the selected word line $WL_S$ instead of the read path voltage $V_{READ}$. In the channel clean period, read path voltages $V_{READK}$, $V_{READL}$, and $V_{READ}$ are supplied to the non-selected word lines $WL_{U1}$, $WL_{U2}$ and $WL_{U3}$, respectively.

At timing t407, the voltage supplied to the bit line BL is changed from the voltage $V_{DD}$ to the voltage $V_{SRC}$.

An operating current $I_{CC}$ is generated in a channel clean period as shown in FIG. 22. In the channel clean period, a read path voltage $V_{READ}$ is charged to a selected word line $WL_S$.

The operation of timing t407 to timing t408 in FIG. 22 corresponds to the second read path voltage supply operation.

At timing t408, the ground voltage $V_{SS}$ is supplied to a selected word line $WL_S$. The ground voltage $V_{SS}$ is supplied to the non-selected word lines $WL_{U1}$, $WL_{U2}$, and $WL_{U3}$.

The sequencer SQC controls the terminal RBn from "H" state to "L" state in response to an input of a command set $CS_{R1}(2)$ from the controller die CD (timing t409). As shown in FIG. 23, the operation from timing t401 to timing t409 is a read operation (first read operations) corresponding to the command set $CS_{R1}(1)$. Thereafter, a read operation corresponding to the command set $CS_{R1}(2)$ is executed.

From timing t410 to timing t412, the voltage of a selected word line $WL_S$ provided in a selected memory block BLK is charged from the ground voltage $V_{SS}$ to the read path voltage $V_{READ}$. Furthermore, the voltages of non-selected word lines $WL_{U1}$, $WL_{U2}$, and $WL_{U3}$ provided in the selected memory block BLK are charged from the ground voltage $V_{SS}$ up to read path voltages $V_{READK}$, $V_{READL}$, and $V_{READ}$, respectively. Consequently, an operating current $I_{CC}$ flowing through the pad electrode Px to which the power supply voltage $V_{CC}$ is supplied increases as shown in FIG. 22.

At timing t411, the sequencer SQC controls the terminal RBn from "L" state to "H" state.

The operation of timing t410 to timing t412 in FIG. 22 corresponds to the first read path voltage supply operation.

At timing t412, the voltage $V_{DD}$ is supplied to a bit line BL. The read voltage $V_{CGFR}$ is supplied to a selected word line $WL_S$. Consequently, the memory cell MC corresponding to Er to E states in FIG. 18A goes to ON state, and the memory cell MC corresponding to F to G states goes to OFF state.

At timing t413, a sensing operation is executed. The sense amplifier SA acquires read data corresponding to the read voltage $V_{CGFR}$. As described above, the operating current $I_{CC}$ flowing through the pad electrode Px to which the power supply voltage $V_{CC}$ is supplied increases when executing the sensing operation.

The read voltage $V_{CGDR}$ is then supplied to a selected word line $WL_S$. Consequently, the memory cell MC corresponding to Er to C states in FIG. 18A goes to ON state, and the memory cell MC corresponding to D to G states goes to OFF state.

At timing t414, a sensing operation is executed. The sense amplifier SA acquires read data corresponding to the read voltage $V_{CGDR}$. At this time, the operating current $I_{CC}$ flowing through the pad electrode Px to which the power supply voltage $V_{CC}$ is supplied increases.

The read voltage $V_{CGBR}$ is then supplied to a selected word line $WL_S$. Consequently, the memory cell MC corresponding to Er to A states in FIG. 18A goes to ON state, and the memory cell MC corresponding to B to G states goes to OFF state.

At timing t415, a sensing operation is executed. The sense amplifier SA acquires read data corresponding to the read voltage $V_{CGBR}$. At this time, the operating current $I_{CC}$ flowing through the pad electrode Px to which the power supply voltage $V_{CC}$ is supplied increases.

The operation from timing t412 to timing t416 corresponds to the read voltage supply operation (first read voltage supply operation) described with reference to FIG. 21. As shown in FIGS. 21 and 22, during the read voltage operation, voltages $V_{READK}$, $V_{READL}$, and $V_{READ}$ are supplied to the non-selected word lines $WL_{U1}$, $WL_{U2}$, and $WL_{U3}$, respectively.

In a channel clean period from timing t416 to timing t417, the read path voltage $V_{READ}$ is supplied to a selected word line $WL_S$. In the channel clean period, voltages $V_{READK}$, $V_{READL}$, $V_{READ}$ are supplied to the non-selected word lines $WL_{U1}$, $WL_{U2}$, $WL_{U3}$, respectively.

Also, at timing t416, the voltage supplied to the bit line BL is changed from the voltage $V_{DD}$ to the voltage $V_{SRC}$.

The operation from timing t416 to timing t417 in FIG. 22 corresponds to the second read path voltage supply operation.

At timing t417, the ground voltage $V_{SS}$ is supplied to the selected word line $WL_S$. The ground voltage $V_{SS}$ is supplied to the non-selected word lines $WL_{U1}$, $WL_{U2}$, and $WL_{U3}$.

The sequencer SQC controls the terminal RBn from "H" state to "L" state in response to an input of a command set $CS_{R1}(3)$ from the controller die CD (timing t418). As shown in FIG. 23, the operation from timing t409 to timing t418 is a read operation (first read operation) corresponding to the command set $CS_{R1}(2)$. Thereafter, a read operation corresponding to the command set $CS_{R1}(3)$ is executed.

In the example shown in FIG. 22, the read operation of a lower bit and a middle bit is illustrated, but the read operation of a higher bit can also be executed. The read operation of the higher bit is basically performed in a similar manner as the read operation of the lower bit and the middle bit. In the read operation of the higher bit, however, a read voltage $V_{CGGR}$ is supplied to a selected word line $WL_S$ to perform a sensing operation. The read voltage $V_{CGCR}$ is then supplied to the selected word line $WL_S$ to perform the sensing operation.

Read Operation of Connection Read

Next, the connection read according to the first embodiment is described.

Figure 24:
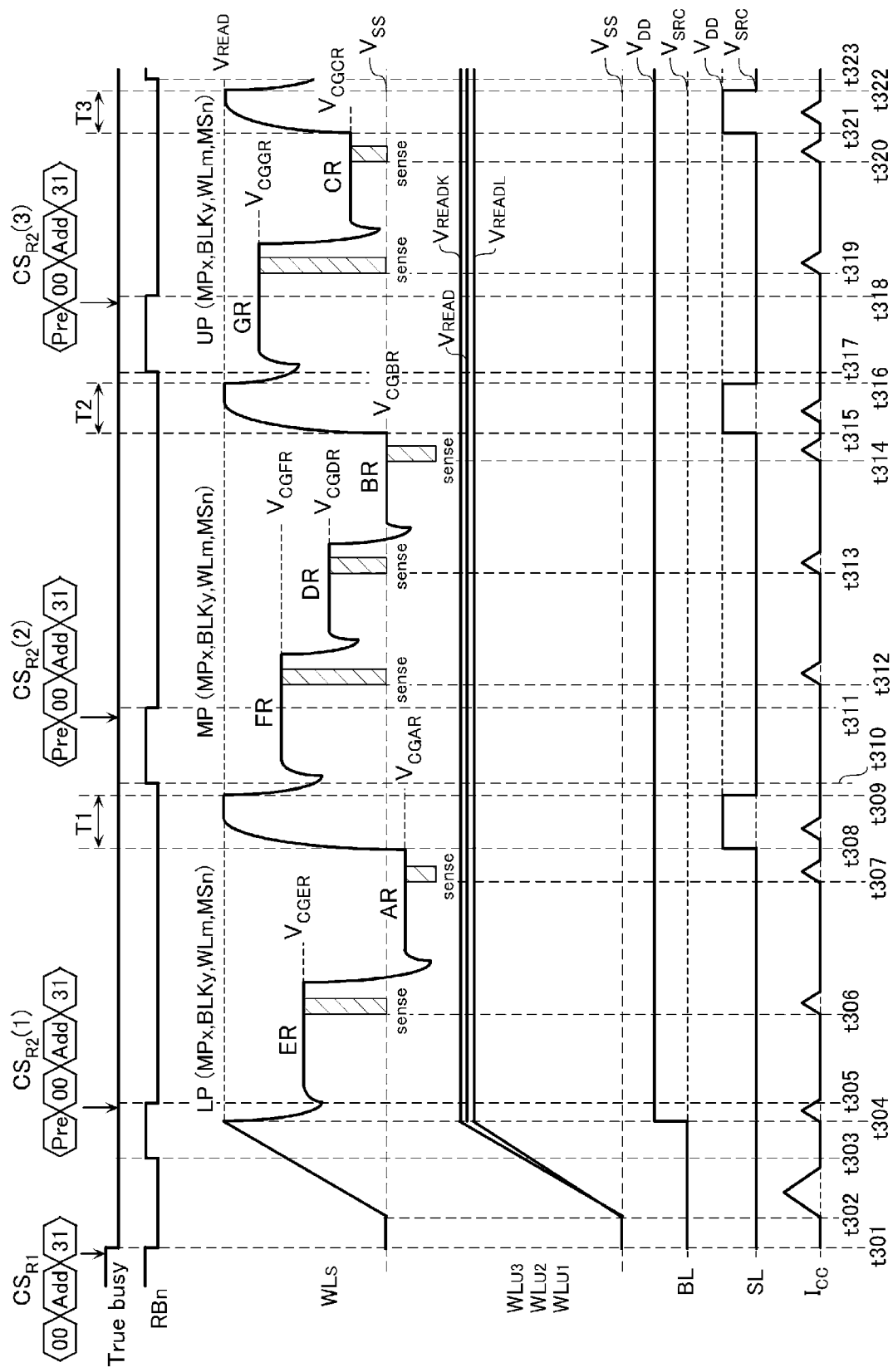
FIG. 24 is a timing chart illustrating a read operation of a connection read according to the first embodiment.

FIG. 24 is a timing chart illustrating the connection read according to the first embodiment. FIG. 25 is a diagram of an example of the command data $D_{CMD}$ and address data $D_{ADD}$ stored in the command register CMR and the address register ADR in the connection read according to the first embodiment. In the following description, the data is allocated to each memory cell MC in the manner illustrated with reference to FIG. 18B, as in a case described with reference to FIG. 22, and examples of reading data from a lower page (LP), a middle page (MP), and an upper page (UP) are described.

At the time of starting the connection read, the controller die CD outputs a command set $CS_{R1}$ for instructing the cache read to the memory die MD through the data signal input/output terminals DQ0 to DQ7. The command set $CS_{R1}$ includes data 00h, Add, and 31h as shown in FIG. 24.

For example, data Add is data specifying a lower page (LP), a memory plane MPLx, a memory block BLKy, a word line WLm, and a memory string MSn which are a target of an operation.

At timing t301, when a command set $CS_{R1}$ is input, data 00h and 31h of the command set $CS_{R1}$ is stored in the command register CMR as command data $D_{CMD}$, and data Add of the command set $CS_{R1}$ is stored in the address register ADR as address data $D_{ADD}$. As shown in FIG. 25, the command register CMR and the address register ADR include "a register of an operation currently being executed" and "a register of an operation to be executed next." Data 00h, Add, and 31h of the command set $CS_{R1}$ are stored in the "register of an operation currently being executed".

The sequencer SQC controls the terminal RBn (ready/busy signal RB) from "H" state to "L" state in response to an input of the command set $CS_{R1}$. As a result, access to the memory die MD is prohibited. Also, a read operation is executed in the memory die MD. Also, when a read operation is started, "True busy" changes from "H" state to "L" state.

From timing t302 to timing t304, the voltage of a selected word line $WL_S$ provided in a selected memory block BLK is charged from the ground voltage $V_{SS}$ to the read path voltage $V_{READ}$. Furthermore, the voltages of non-selected word lines $WL_{U1}$, $WL_{U2}$, and $WL_{U3}$ provided in the selected memory block BLK are charged from the ground voltage $V_{SS}$ up to read path voltages $V_{READK}$, $V_{READL}$, and $V_{READ}$, respectively. The voltage $V_{SRC}$ is supplied to a bit line BL and a source line SL provided in the selected memory block BLK.

As in a case described at timing t402 of FIG. 22, the operating current $I_{CC}$ flowing through the pad electrode Px to which a power supply voltage $V_{CC}$ is supplied increases at the timing t302 of FIG. 24.

At timing t303, the sequencer SQC controls the terminal RBn from "L" state to "H" state.

The operation from timing t302 to timing t304 in FIG. 24 corresponds to the first read path voltage supply operation.

At timing t304, the bit line BL is charged to the voltage $V_{DD}$. The operating current $I_{CC}$ flowing through a pad electrode Px to which the power supply voltage $V_{CC}$ is supplied increases as in a case described at the timing t404 in FIG. 22.

Also, at timing t304, a voltage lower than the read voltage $V_{CGER}$ is supplied to a selected word line $WL_S$, and then a read voltage $V_{CGER}$ is supplied. Consequently, the memory cell MC corresponding to Er to D states in FIG. 18A goes to ON state, and the memory cell MC corresponding to E to G states goes to OFF state. Hereafter, the description "to supply the read voltage $V_{CGR}$ to a selected word line $WL_S$" means "to supply the read voltage $V_{CGR}$ after supplying a voltage lower than the read voltage $V_{CGR}$ to the selected word line $WL_S$".

The sequencer SQC controls the terminal RBn from "H" state to "L" state in response to an input of a command set $CSR_2(1)$ for instructing the connection read (timing t305). In order to distinguish a plurality of command sets $CS_{R2}$, a number is appended to the command set $CS_{R2}$.

The command set $CS_{R2}(1)$ includes data XXh(Pre), 00h, Add, and 31h as shown in FIG. 24. The sequencer SQC recognizes the connection read mode by the command set $CS_{R2}(1)$ to which data Pre(XXh) is added.

When the command set $CS_{R2}(1)$ is input, data XXh(Pre), 00h, and 31h of the command set $CS_{R2}(1)$ is stored in the command register CMR as command data $D_{CMD}$, and data Add of the command set $CS_{R2}(1)$ is stored in the address register ADR as address data $D_{ADD}$. As shown in FIG. 25, data XXh (Pre), 00h, Add, and 31h of the command set $CS_{R2}(1)$ are stored in "a register of an operation to be executed next".

The data Add provided in the command set $CS_{R2}(1)$ is data specifying, for example, a middle page (MP), a memory plane MPLx, a memory block BLKy, a word line WLm, and a memory string MSn which are a target of an operation.

The memory plane (MPx), the memory block (BLKy), the word line (WLm), and the memory string (MSn) are common between the address data $D_{ADD}$ provided in the command set $CS_{R1}$ and the address data $D_{ADD}$ provided in the command set $CS_{R2}(1)$.

At timing t306, a sensing operation ("sense" in FIG. 24) is executed. The sense amplifier SA acquires read data corresponding to the read voltage $V_{CGER}$. At this time, the operating current $I_{CC}$ flowing through the pad electrode Px to which the power supply voltage $V_{CC}$ is supplied increases.

The read voltage $V_{CGAR}$ is then supplied to a selected word line $WL_S$. Consequently, the memory cell MC corresponding to Er state in FIG. 18A goes to ON state, and the memory cell MC corresponding to A to G states goes to OFF state.

At timing t307, a sensing operation is executed. The sense amplifier SA acquires read data corresponding to the read voltage $V_{CGAR}$. At this time, the operating current $I_{CC}$ flowing through the pad electrode Px to which the power supply voltage $V_{CC}$ is supplied increases. The sense amplifier module SAM transfers read data acquired by the sensing operation to the cache memory CM. The cache memory CM outputs a signal indicating that read data transferred from the sense amplifier module SAM is stored in a latch circuit XDL to the sequencer SQC.

The operation from timing t304 to timing t308 corresponds to the read voltage supply operation (first read voltage supply operation) described with reference to FIG. 21. As shown in FIG. 21 and FIG. 24, the read path voltage $V_{READK}$ is supplied to the non-selected word line $WL_{U1}$ during the read voltage supply operation. The read path voltage $V_{READL}$ is supplied to the non-selected word line $WL_{U2}$. The read path voltage $V_{READ}$ is supplied to the non-selected word line $WL_{U3}$.

In a period from timing t308 to timing t309, the read path voltage $V_{READ}$ is supplied to a selected word line $WL_S$. The period from timing t308 to timing t309 is a channel clean period similar to the period from timing t407 to timing t408 in FIG. 22. In the channel clean period, read path voltages $V_{READK}$, $V_{READL}$, and $V_{READ}$ are supplied to non-selected word lines $WL_{U1}$, $WL_{U2}$ and $WL_{U3}$, respectively.

In the channel clean period, the voltage $V_{DD}$ is supplied to the source line SL. Consequently, the bit line BL and the source line SL have the same potential. In the channel clean period, since the plurality of read path voltages $V_{READK}$, $V_{READL}$, and $V_{READ}$ are supplied to all word lines WL of the block BLKy, all memory cells MC connected to these word lines WL are in ON state. Accordingly, when there is a potential difference between the bit line BL and the source line SL, a through current flows between the bit line BL and the source line SL. A through current is prevented from flowing by making the bit line BL and the source line SL have the same voltage $V_{DD}$.

In the connection read, the supply of read path voltages $V_{READK}$, $V_{READL}$, and $V_{READ}$ to the word line WL (selected word line $WL_S$ and non-selected word line $WL_{U1}$, $WL_{U2}$, and $WL_{U3}$) in the channel clean period also charges the read path voltage VREAD to the word line WL (especially, non-selected word line $WL_U$) in the next read operation. That is, in the connection read, the read path voltages $V_{READK}$, $V_{READL}$, and $V_{READ}$ supplied to the word lines WL in the channel clean period are not discharged, and are reused as charging voltages of the read path voltages $V_{READK}$, $V_{READL}$, and $V_{READ}$ to the word lines WL in the next read operation. Accordingly, an operating current $I_{CC}$ when charging the read path voltages $V_{READK}$, $V_{READL}$, and $V_{READ}$ to the word line WL is not generated.

An operating current $I_{CC}$ is generated in a channel clean period as shown in FIG. 24. This is because, in the channel clean period, the read path voltage $V_{READ}$ is charged to a selected word line $WL_S$. However, the operating current Ice in the channel clean period is smaller than the operating current $I_{CC}$ when charging the plurality of read path voltages $V_{READK}$, $V_{READL}$, and $V_{READ}$ to all word lines WL (operating current Ice in a period from timing t302 to timing t304). During the period from timing t302 to timing t304, all word lines WL in the selected memory block BLK are charged from a ground voltage $V_{SS}$ to read path voltages $V_{READK}$, $V_{READL}$, and $V_{READ}$, while only the selected word line $WL_S$ is charged from the read voltage $V_{CGAR}$ to the read path voltage $V_{READ}$ in the channel clean period (in the period from timing t308 to timing t309).

In the connection read, on the condition that the memory plane MPL and the memory block BLK are the same as those in the read operation executed previously (for example, the first read operation from timing t301 to timing t309), charging of the read path voltage $V_{READ}$ to the selected word line $WL_S$ in the read operation to be executed in the connection read can be omitted. In the case of continuously executing the first read operation (for example, operation from timing t301 to timing t309) and the second read operation (for example, operation from timing t309 to timing t316), if the memory plane MPL and the memory block BLK which are the targets of operations are the same, read path voltages $V_{READK}$, $V_{READL}$, and $V_{READ}$ are supplied to all word lines WL in the memory block BLK which is a target of the first read operation. In such a case, no matter which of the plurality of word lines WL in the memory block BLK is selected as the selected word line $WL_S$, the first read path voltage supply operation can be omitted in the second read operation.

When the command set $CS_{R2}(1)$ is input, if the memory plane MPL or the memory block BLK specified by the data Add of the command set $CS_{R2}(1)$ is different from the memory plane MPL or the memory block BLK in the previous read operation, a cache read operation (first read operation) is executed (see FIG. 22).

The operation from timing t308 to timing t310 in FIG. 24 corresponds to the second read path voltage supply operation.

At timing t309, the read voltage $V_{CGFR}$ is supplied to a selected word line $WL_S$. Consequently, the memory cell MC corresponding to Er to E states in FIG. 18A goes to ON state, and the memory cell MC corresponding to F to G states goes to OFF state. In the read operation (i.e., second read operation) of the connection read, an operation corresponding to the first read path voltage supply operation in the read operation (i.e., first read operation) of the cache read is omitted. A voltage $V_{SRC}$ is supplied to the source line SL. At this time, the voltage of the bit line BL is maintained at the voltage $V_{DD}$.

At timing t310, the sequencer SQC controls the terminal RBn from "L" state to "H" state in response to the input of a signal from the cache memory CM (a signal indicating that read data is stored in the latch circuit XDL). At timing t311, the sequencer SQC controls the terminal RBn from "H" state to "L" state in response to the input of the command set $CS_{R2}(2)$ (timing t311). As shown in FIG. 25, the operation from timing t301 to timing t310 is a read operation (first read operation) corresponding to the command set $CS_{R1}$. Thereafter, a read operation corresponding to the command set $CS_{R2}(1)$ is executed.

The sequencer SQC recognizes a connection read mode by the command set $CS_{R2}(2)$ to which data Pre(XXh) is added.

When the command set $CS_{R2}(2)$ is input, data XXh(Pre), 00h, and 31h of the command set $CS_{R2}(2)$ is stored in the command register CMR as command data $D_{CMD}$, and data Add of the command set $CS_{R2}(2)$ is stored in the address register ADR as address data $D_{ADD}$. As shown in FIG. 25, data XXh (Pre), 00h, Add, and 31h of the command set $CS_{R2}(2)$ are stored in "a register of an operation to be executed next".

The data Add provided in the command set $CS_{R2}(2)$ is data specifying, for example, an upper page (UP), a memory plane MPLx, a memory block BLKy, a word line WLm, and a memory string MSn which are a target of an operation.

The memory plane (MPx), the memory block (BLKy), the word line (WLm), and the memory string (MSn) are common between the address data $D_{ADD}$ provided in the command set $CS_{R2}(1)$ and the address data $D_{ADD}$ provided in the command set $CS_{R2}(2)$.

At timing t310, a voltage of the selected word line $WL_S$ may be maintained equal to or higher than a predetermined voltage, the predetermined voltage is one third of the read pass voltage.

At timing t312, a sensing operation is executed. The sense amplifier SA acquires read data corresponding to the read voltage $V_{CGFR}$. As described above, the operating current $I_{CC}$ flowing through the pad electrode Px to which a power supply voltage $V_{CC}$ is supplied increases when executing the sensing operation.

The read voltage $V_{CGDR}$ is then supplied to a selected word line $WL_S$. Consequently, the memory cell MC corresponding to Er to C states in FIG. 18A goes to ON state, and the memory cell MC corresponding to D to G states goes to OFF state.

Also, a sensing operation is executed at timing t313. The sense amplifier SA acquires read data corresponding to the read voltage $V_{CGDR}$. At this time, the operating current $I_{CC}$ flowing through the pad electrode Px to which a power supply voltage $V_{CC}$ is supplied increases.

The read voltage $V_{CGBR}$ is then supplied to a selected word line $WL_S$. Consequently, the memory cell MC corresponding to Er to A states in FIG. 18A goes to ON state, and the memory cell MC corresponding to B to G states goes to OFF state.

At timing t314, a sensing operation is executed. The sense amplifier SA acquires read data corresponding to the read voltage $V_{CGBR}$. At this time, the operating current $I_{CC}$ flowing through the pad electrode Px to which a power supply voltage $V_{CC}$ is supplied increases. The sense amplifier module SAM transfers the read data acquired by the sensing operation to the cache memory $C_M$. The cache memory $C_M$ outputs a signal indicating that the read data transferred from the sense amplifier module SAM is stored in the latch circuit XDL, to the sequencer SQC.

The operation from timing t309 to timing t315 corresponds to the read voltage supply operation (second read voltage supply operation) described with reference to FIG. 21. As shown in FIGS. 21 and 24, during the read voltage supply operation, voltages $V_{READK}$, $V_{READL}$, and $V_{READ}$ are supplied to non-selected word lines $WL_{U1}$, $WL_{U2}$, and $WL_{U3}$, respectively.

In the channel clean period from timing t315 to timing t316, the same operation as in the channel clean period from timing t308 to timing t309 is executed. In other words, the read path voltage $V_{READ}$ is supplied to a selected word line $WL_S$ in the channel clean period. In the channel clean period, voltages $V_{READK}$, $V_{READL}$, $V_{READ}$ are supplied to non-selected word lines $WL_{U1}$, $WL_{U2}$, $WL_{U3}$, respectively.

In the channel clean period, the voltage $V_{DD}$ is supplied to the source line SL. Consequently, the bit line BL and the source line SL have the same potential, and a through current is prevented from flowing. In the channel clean period, the plurality of read path voltages $V_{READK}$, $V_{READL}$, and $V_{READ}$ supplied to all word lines WL are not discharged, and are reused as a charging voltage of the read path voltage $V_{READ}$ to a selected word line $WL_S$ in the next read operation.

In the read operation to be executed next in the connection read (for example, the second read operation from timing t316 to timing t322), on the condition that the memory plane MPL and the memory block BLK are the same as those in the read operation executed previously in a connection read (for example, the second read operation from timing t309 to timing t316), charging of the read path voltage $V_{READ}$ to the selected word line $WL_S$ can be omitted. When executing the second read operation twice in a row, if the memory plane MPL and the memory block BLK which are the targets of the operations are the same, read path voltages $V_{READK}$, $V_{READL}$, $V_{READ}$ are supplied to all word lines WL in the memory block BLK which is a target of the second read operation to be executed previously. In such a case, no matter which of the plurality of word lines WL in the memory block BLK is selected as the selected word line $WL_S$, the first read path voltage supply operation can be omitted in the next second read operation.

The operation from timing t315 to timing t316 in FIG. 24 corresponds to the third read path voltage supply operation.

At timing t316, the read voltage $V_{CGGR}$ is supplied to a selected word line $WL_S$. Consequently, the memory cell MC corresponding to Er to F states in FIG. 18A goes to ON state, and the memory cell MC corresponding to G state goes to OFF state. The voltage $V_{SRC}$ is supplied to the source line SL. At this time, the voltage of the bit line BL is maintained at the voltage $V_{DD}$.

At timing t317, the sequencer SQC controls the terminal RBn from "L" state to "H" state in response to the input of a signal from the cache memory CM (a signal indicating that read data is stored in the latch circuit XDL). Further, the sequencer SQC controls the terminal RBn from "H" state to "L" state in response to the input of the command set $CS_{R2}(3)$ (timing t318). As shown in FIG. 25, the operation from timing t310 to timing t317 is the read operation (i.e., second read operation) corresponding to the command set $CS_{R2}(1)$. Thereafter, a read operation (operation from timing t317 to timing t323) corresponding to the command set $CS_{R2}(2)$ is executed.

The sequencer SQC recognizes the connection read mode by the command set $CS_{R2}(3)$ to which data Pre(XXh) is added.

When the command set $CS_{R2}(3)$ is input, data XXh(Pre), 00h, and 31h of the command set $CS_{R2}(3)$ is stored in the command register CMR as command data $D_{CMD}$, and data Add of the command set $CS_{R2}(3)$ is stored in the address register ADR as address data $D_{ADD}$. As shown in FIG. 25, data XXh (Pre), 00h, Add, and 31h of the command set $CS_{R2}(3)$ are stored in "a register of an operation to be executed next".

Although not shown in FIG. 24, the data Add provided in the command set $CS_{R2}(3)$ is data specifying, for example, an upper page (UP), a memory plane MPLx, a memory block BLKy, a word line WLm, and a memory string MSn which are a target of an operation.

At timing t319, a sensing operation is executed. The sense amplifier SA acquires read data corresponding to the read voltage $V_{CGGR}$. As described above, the operating current $I_{CC}$ flowing through the pad electrode Px to which the power supply voltage $V_{CC}$ is supplied increases when executing the sensing operation.

The read voltage $V_{CGCR}$ is then supplied to a selected word line $WL_S$. Consequently, the memory cell MC corresponding to Er to B states in FIG. 18A goes to ON state, and the memory cell MC corresponding to C to G states goes to OFF state.

Also, in timing t320, a sensing operation is executed. The sense amplifier SA acquires read data corresponding to the read voltage $V_{CGCR}$. At this time, the operating current $I_{CC}$ flowing through the pad electrode Px to which the power supply voltage $V_{CC}$ is supplied increases. The sense amplifier module SAM transfers the read data acquired by the sensing operation to the cache memory CM. The cache memory CM outputs a signal indicating that the read data transferred from the sense amplifier module SAM is stored in the latch circuit XDL to the sequencer SQC.

The operation from timing t316 to timing t321 corresponds to the read voltage supply operation (second read voltage supply operation) described with reference to FIG. 21. As shown in FIGS. 21 and 24, during the read voltage supply operation, voltages $V_{READK}$, $V_{READL}$, and $V_{READ}$ are supplied to non-selected word lines $WL_{U1}$, $WL_{U2}$, and $WL_{U3}$, respectively.

In the channel clean period from timing t321 to timing t322, the same operation as in the channel clean period from timing t308 to timing t309 and the channel clean period from timing t315 to timing t316 is executed.

The operation from timing t321 to timing t322 in FIG. 24 corresponds to the third read path voltage supply operation.

At timing t323, the sequencer SQC controls the terminal RBn from "L" state to "H" state in response to the input of a signal from the cache memory $C_M$ (a signal indicating that read data is stored in the latch circuit XDL). Consequently, a command set can be accepted.

Effects

In accordance with the high integration of semiconductor memory devices, the number of conductive layers 110 (FIGS. 14 and 15) stacked in the Z direction is increasing. As a result, the amount of charge required for charging the word lines WL (especially the non-selected word lines WL) increases, and the operating current $I_{CC}$ flowing through the pad electrode Px to which the power supply voltage $V_{CC}$ is supplied is increasing. Consequently, power consumption and heat generation may increase. In order to reduce such an operating current $I_{CC}$, for example, the time from timing t410 to timing t412 in FIG. 22 can be extended to reduce the amount of charge moving per unit time. However, in such a case, the time required for the read operation of a plurality of pages may be prolonged.

In the present embodiment, the read path voltages $V_{READK}$, $V_{READL}$, and $V_{READ}$ supplied to the word lines WL in the channel clean period are not discharged, and are reused as charging voltages of the read path voltages $V_{READK}$, $V_{READL}$, and $V_{READ}$ to the word lines WL in the next read operation. Accordingly, the operating current $I_{CC}$ when charging read path voltages $V_{READK}$, $V_{READL}$, and $V_{READ}$ to the word lines WL (especially, non-selected word lines $WL_U$) can be reduced.

In the present embodiment, on the condition that the memory planes MPL and the memory blocks BLK are the same, charging of the read path voltage $V_{READ}$ to a selected word line $WL_S$ in a read operation can be omitted. Accordingly, the time required for the reading operation of the plurality of pages can be shortened.

In addition, in the "register of an operation to be executed next" shown in FIG. 25, in some cases, not only data of a command set $CS_{R2}$ for instructing a connection read but also data of a command set $CS_{R1}$ for instructing a cache read are stored. For example, the plane address or block address of the first read operation or the second read operation currently being executed and the plane address or block address of the read operation to be executed next may differ. In such a case, since the read operation (second read operation) of a connection read cannot be executed as described above, a command set $CS_{R1}$ for instructing a cache read is input. The command set $CS_{R1}$ is stored in a "register of an operation to be executed next". Alternatively, the "register of an operation to be executed next" may be a dedicated register that stores only the command set $CS_{R2}$.

In addition, when there is no vacancy in the address register ADR and the command register CMR which are the "registers of an operation currently being executed" in FIG. 23, the memory die MD cannot accept any command set and does not execute an operation based on the command set. In addition, if there is no vacancy in the two sets of address registers ADR and the command register CMR which are "registers of an operation currently being executed" and "registers of an operation to be executed next" in FIG. 25, the memory die MD cannot accept any command set and does not execute an operation based on the command set.

Second Embodiment

In a connection read according to a second embodiment, the length of a channel clean period is changed according to the level of the read voltage $V_{CGR}$ supplied to a selected word line $WL_S$ immediately before the channel clean period.

As shown in FIG. 24, the read voltage $V_{CGR}$ supplied to the selected word line $WL_S$ immediately before the channel clean period (timing t308 to timing t309) is the read voltage $V_{CGAR}$ corresponding to A state. In such a case, the length of the channel clean period (timing t308 to timing t309) is time T1. The read voltage $V_{CGR}$ supplied to the selected word line $WL_S$ immediately before the channel clean period (timing t315 to timing t316) is the read voltage $V_{CGBR}$ corresponding to B state. In such a case, the length of the channel clean period (timing t315 to timing t316) is time T2. The read voltage $V_{CGR}$ supplied to the selected word line $WL_S$ immediately before the channel clean period (timing t321 to timing t322) is the read voltage $V_{CGCR}$ corresponding to C state. In such a case, the length of the channel clean period (timing t321 to timing t322) is time T3.

The time required to raise the voltage supplied to the selected word line $WL_S$ from the read voltage $V_{CGAR}$ to the read path voltage $V_{READ}$, the time required to raise the read voltage $V_{CGBR}$ to the read path voltage $V_{READ}$, and the time required to raise from the read voltage $V_{CGCR}$ to the read path voltage $V_{READ}$ are different from each other. In the second embodiment, the length of the channel clean period is changed according to the level of the read voltage $V_{CGR}$ supplied to the selected word line $WL_S$ immediately before the channel clean period.

In the example shown in FIG. 24, the read voltage $V_{CGAR}$ is smaller than the read voltage $V_{CGBR}$. For that reason, the time taken to raise from the read voltage $V_{CGAR}$ to the read path voltage $V_{READ}$ is longer than the time taken to raise from the read voltage $V_{CGBR}$ to the read path voltage $V_{READ}$. Accordingly, time T1 of the channel clean period is made longer than time T2.

Also, the read voltage $V_{CGBR}$ is smaller than the read voltage $V_{CGCR}$. For that reason, the time taken to raise from the read voltage $V_{CGBR}$ to the read path voltage $V_{READ}$ is longer than the time taken to raise from the read voltage $V_{CGCR}$ to the read path voltage $V_{READ}$. Accordingly, time T2 of the channel clean period is made longer than time T3.

According to the configuration of the second embodiment, the length of the channel clean period can be appropriately adjusted according to the level of the read voltage $V_{CGR}$.

Third Embodiment

In a connection read according to a third embodiment, when another command set $CS_{R2}$' is input after the command set $CS_{R2}$ is input, the command set $CS_{R2}$ is replaced with another command set $CS_{R2}$'.

Figure 26:
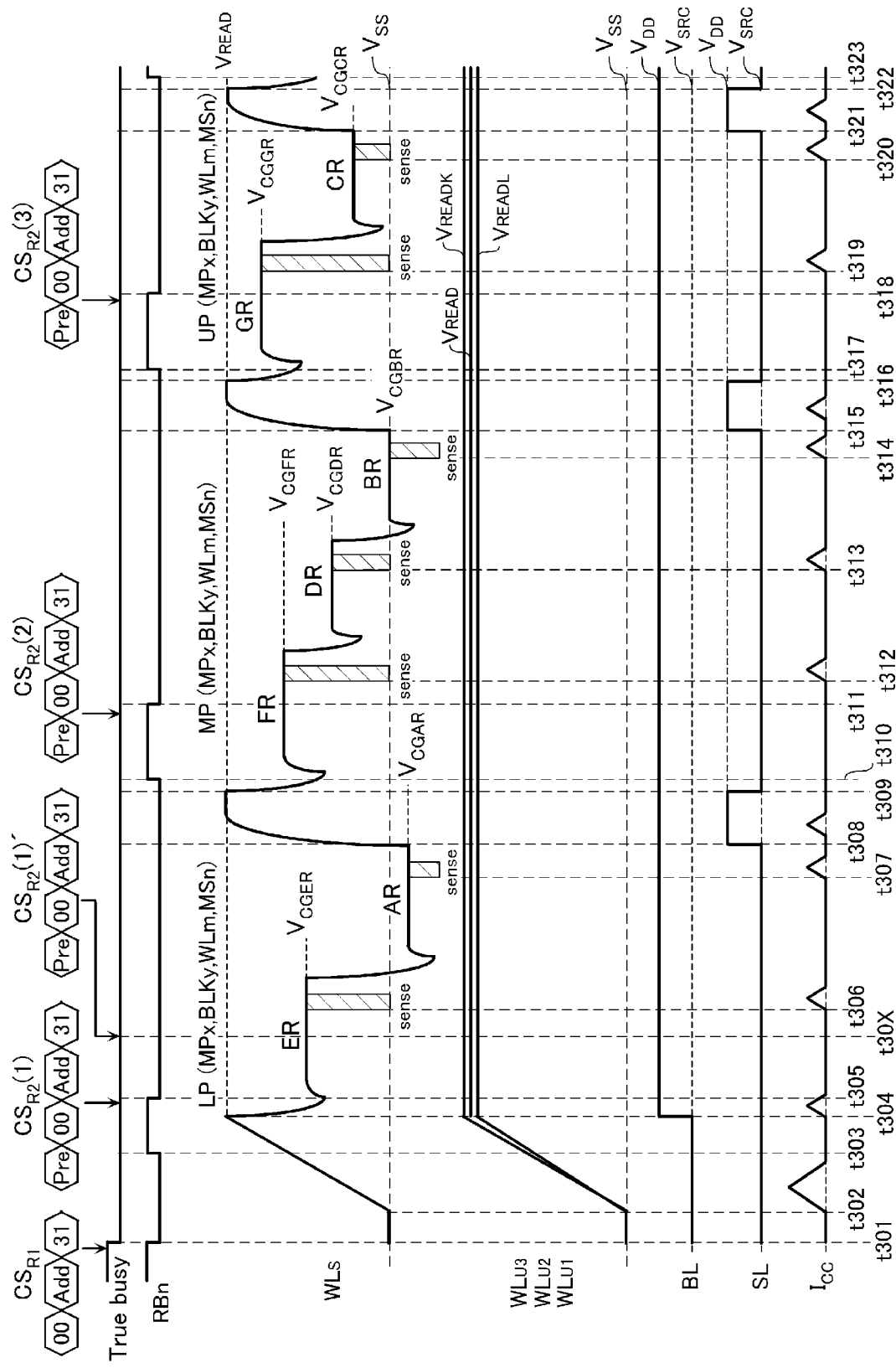
FIG. 26 is a timing chart illustrating a read operation of a connection read according to a third embodiment.

FIG. 26 is a timing chart illustrating the read operation of the connection read according to the third embodiment. FIG. 27 is a diagram of an example of the command data $D_{CMD}$ and address data $D_{ADD}$ stored in the command register CMR and the address register ADR during the connection read according to the third embodiment. Because the operation from timing 301 to timing t323 in FIG. 26 (except for timing t30X) is the same as the operation described in FIG. 24, duplicate description is omitted.

A command set $CS_{R2}(1)$ for instructing a connection read is input in the same way as in the first embodiment. In the third embodiment, after the command set $CS_{R2}(1)$ is input, when a command set $CS_{R2}(1)$' is newly input at timing t30X of FIG. 26, the already input command set $CS_{R2}(1)$ is replaced with the newly input command set $CS_{R2}(1)$'. For example, the data of the command set $CS_{R2}(1)$ stored in the "register of an operation to be executed next" is overwritten with the data of the command set $CS_{R2}(1)$' as shown in FIG. 27. In this case, in the operation from timing t310 to timing t311 and from timing t311 to timing t317, the operation specified in the data of the command set $CS_{R2}(1)$' is executed.

The state (ready/busy signal RB) of the terminal RBn indicates whether a command set can be accepted. As described above, the command set can be accepted when the terminal RBn is in "H" state (i.e., ready period), and the command set cannot be accepted when the terminal RBn is in "H" state (i.e., busy period). However, the data Pre(XXh) means a special command indicating that the memory die MD can accept even during the busy period. The memory die MD recognizes the special command set by a prefix command (e.g., data XXh(Pre)) being added to the command set $CS_{R2}$ and inputs and accepts such a command set exceptionally even during the busy period.

However, when the terminal RBn (ready/busy signal RB) is in "L" state (i.e., busy state), the memory die MD does not execute an operation based on a command set even when the command set to which the prefix command (e.g., data XXh(Pre)) is not added is input.

A period during which a replacement command set $CS_{R2}(1)$' can be input is a period up to a timing for ending the first read voltage supply operation (i.e., a timing at which a channel clean period is started: t308). Even if the command set $CS_{R2}(1)$' is input after the channel clean period is started, the connection read cannot be executed.

In addition, in the "register of an operation to be executed next" shown in FIG. 27, in some cases, not only data of a command set $CS_{R2}$ for instructing the connection read but also data of a command set $CS_{R1}$ for instructing the cache read are stored. However, the "register of an operation to be executed next" may be a dedicated register that stores only the command set $CS_{R2}$.

According to the configuration of the third embodiment, after the controller die CD outputs the command set $CS_{R2}(1)$, for example, even if it is necessary to read data with addresses different from address specified in the command set $CS_{R2}(1)$ first, by outputting another command set $CS_{R2}(1)$' data of the command set $CS_{R2}(1)$ stored in the register can be replaced with data of the other command set $CS_{R2}(1)$'.

Fourth Embodiment

In a connection read according to the first embodiment, the read voltage $V_{CGR}$ supplied to a selected word line $WL_S$ is switched from a read voltage of a high level to a read voltage of a low level. In a connection read according to the fourth embodiment, the read voltage $V_{CGR}$ supplied to a selected word line $WL_S$ is switched from a read voltage of a low level to a read voltage of a high level.

Figure 28:
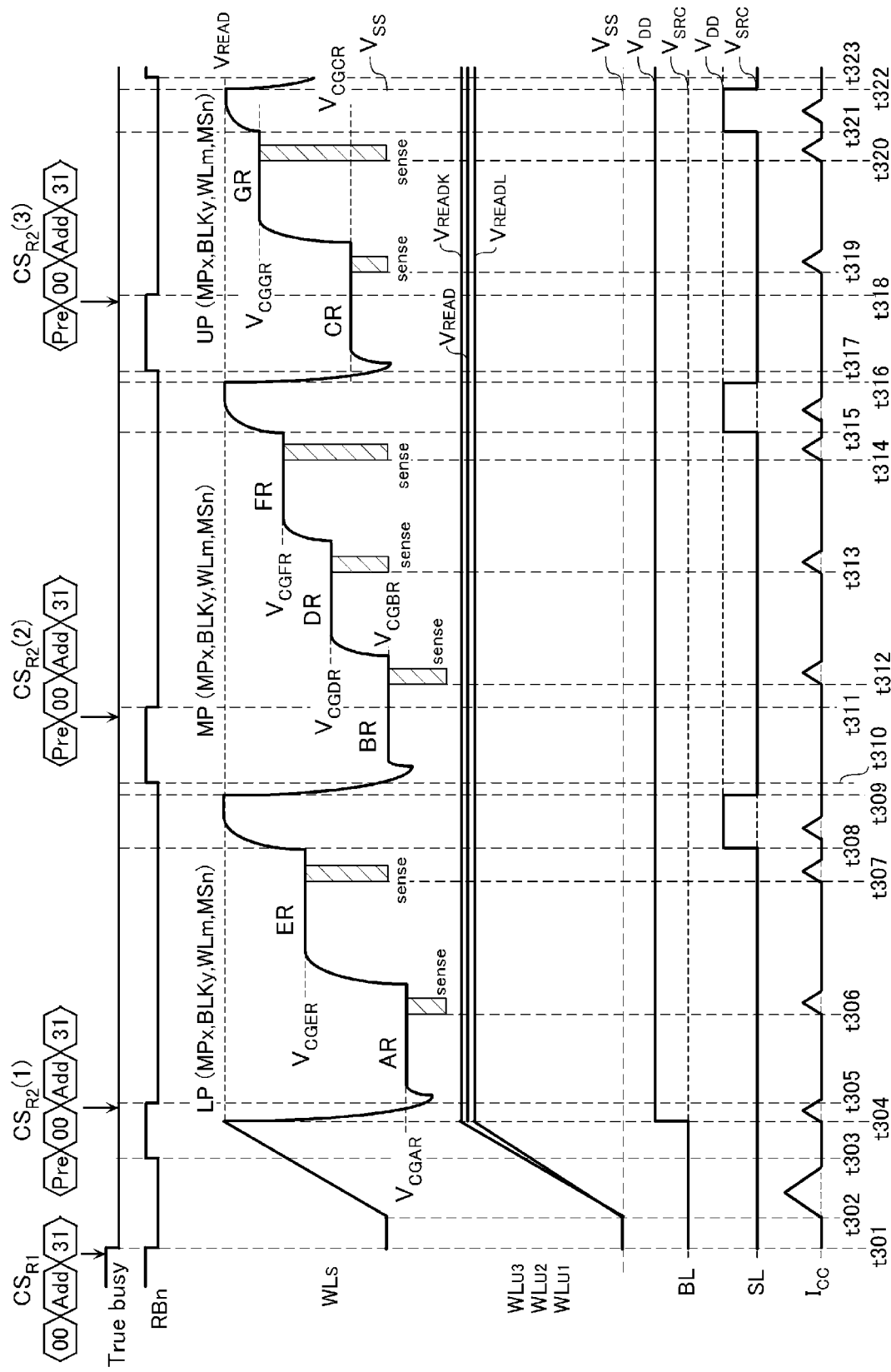
FIG. 28 is a timing chart illustrating a read operation of a connection read according to a fourth embodiment.

FIG. 28 is a timing chart illustrating the read operation of a connection read according to the fourth embodiment.

In the read voltage supply operation of a connection read according to the first embodiment, as shown in FIG. 24, read voltage $V_{CGER}$ and $V_{CGAR}$ are supplied to a selected word line $WL_S$ in this order, read voltages $V_{CGFR}$, $V_{CGDR}$, and $V_{CGBR}$ are supplied to the selected word line $WL_S$ in this order, and read voltages $V_{CGGR}$ and $V_{CGCR}$ are supplied to the selected word line $WL_S$ in this order. In contrast, in the read voltage supply operation of the connection read according to the fourth embodiment, as shown in FIG. 28, read voltage $V_{CGAR}$ and $V_{CGER}$ are supplied to the selected word line $WL_S$ in this order, read voltages $V_{CGBR}$, $V_{CGDR}$, and $V_{CGFR}$ are supplied to the selected word line $WL_S$ in this order, and read voltages $V_{CGCR}$ and $V_{CGGR}$ are supplied to the selected word line $WL_S$ in this order. Since the rest of the configuration is the same as the contents described with reference to FIG. 24, duplicate description is omitted.

Even in such a configuration, the operating current $I_{CC}$ when charging the read path voltages $V_{READK}$, $V_{READL}$, and $V_{READ}$ to the word line WL (especially, non-selected word line $WL_U$) can be reduced, and the time required for the read operation of a plurality of pages can be shortened.

Fifth Embodiment

Figure 29:
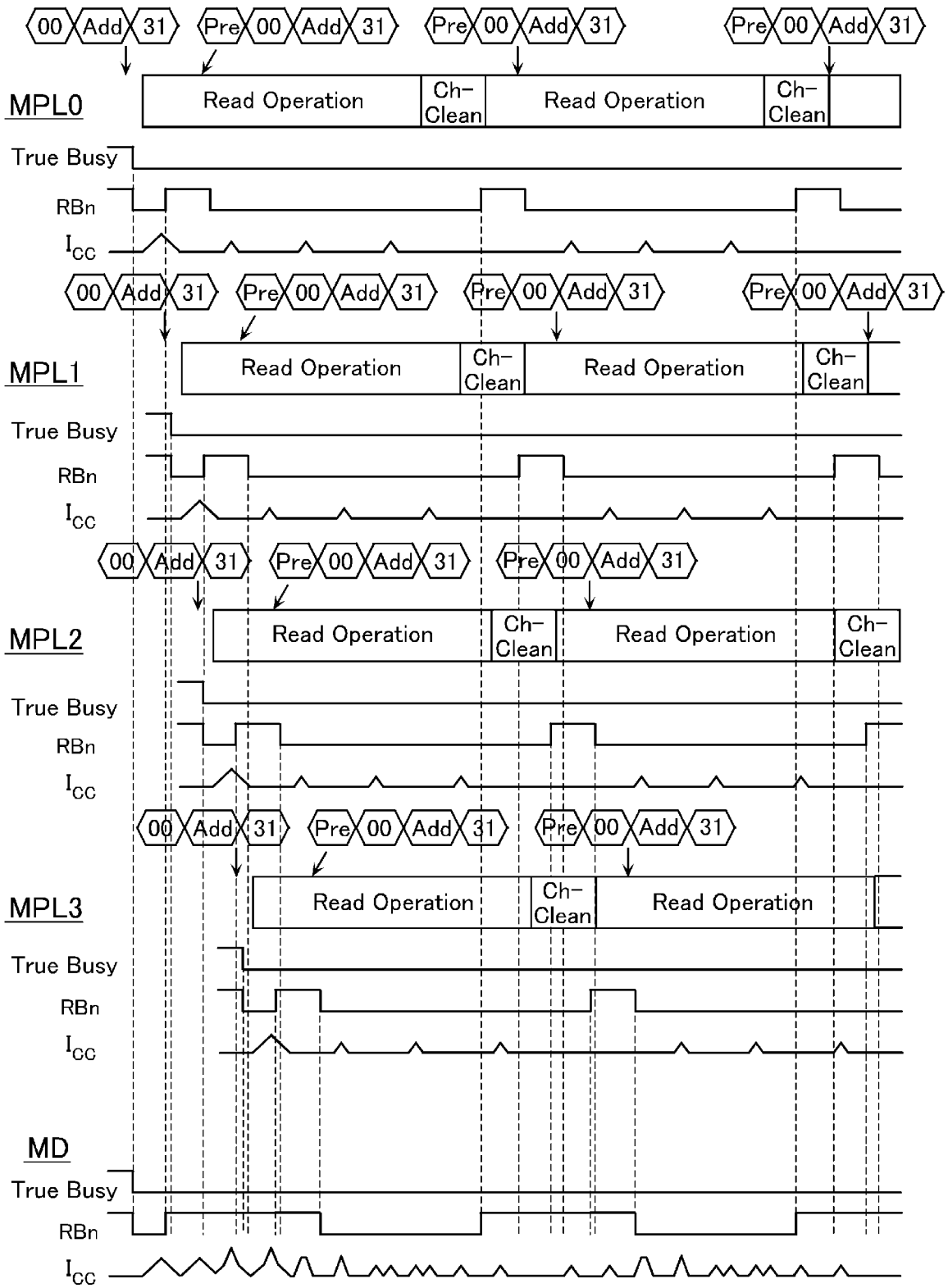
FIG. 29 is a schematic timing chart illustrating a read operation of a connection read according to a fifth embodiment.

Next, a connection read in a plurality of memory planes MPL according to a fifth embodiment is described with reference to FIG. 29. FIG. 29 is a timing chart illustrating the connection read according to the fifth embodiment.

A memory die MD (chip $C_M$) includes four memory planes MPL0 to MPL3, as described with the reference to FIG. 13. The semiconductor memory device according to the fifth embodiment can simultaneously execute the connection read or execute the connection read in parallel at an independent timing on a plurality of selected pages PG provided in the memory planes MPL0 to MPL3 which are different from each other. This function may be referred to as asynchronous independent plane read (AIPR).

In FIG. 29, "Read Operation" corresponds, for example, to the operation from timing t304 to timing t308, from timing t309 to timing t315, and from timing t316 to timing t321 in FIG. 24. Also, "Ch-Clean" corresponds, for example, to the channel clean period from timing t308 to timing t309, from timing t315 to timing t316, and from timing t321 to timing t322 in FIG. 24.

In each of the four memory planes MPL0 to MPL3, "True Busy" goes to "L" state during the execution of a read operation. Also, the four memory planes MPL0 to MPL3 output a ready/busy signal RB from the terminal RBn, respectively. Also, the four memory planes MPL0 to MPL3 input command sets $CS_{R1}$ and $CS_{R2}$, respectively and execute operations corresponding to the command sets $CS_{R1}$ and $CS_{R2}$. An operating current Ice corresponding to the operation of the four memory planes MPL0 to MPL3 is generated, respectively.

A ready/busy signal RB of the memory die MD is output as an OR condition of ready/busy signals RB of respective memory planes MPL0 to MPL3. Further, the controller die CD cannot simultaneously output a plurality of command sets $CS_{R1}$ and $CS_{R2}$. Accordingly, the controller die CD outputs command sets $CS_{R1}$ and $CS_{R2}$ to each of the memory planes MPL0 to MPL3 so that output timings of the command sets $CS_{R1}$ and $CS_{R2}$ to each of the memory planes MPL0 to MPL3 are offset. The operating current Ice in the memory die MD is obtained by adding operating currents Ice of respective memory planes MPL0 to MPL3.

According to the configuration of the fifth embodiment, in each of the memory planes MPL0 to MPL3, the operating current Ice when charging read path voltages $V_{READK}$, $V_{READL}$, and $V_{READ}$ to the word line WL (especially non-selected word lines $WL_U$) can be reduced and as a result, the operating current $I_{CC}$ in the memory die MD can be further reduced.

Sixth Embodiment

Figure 30:
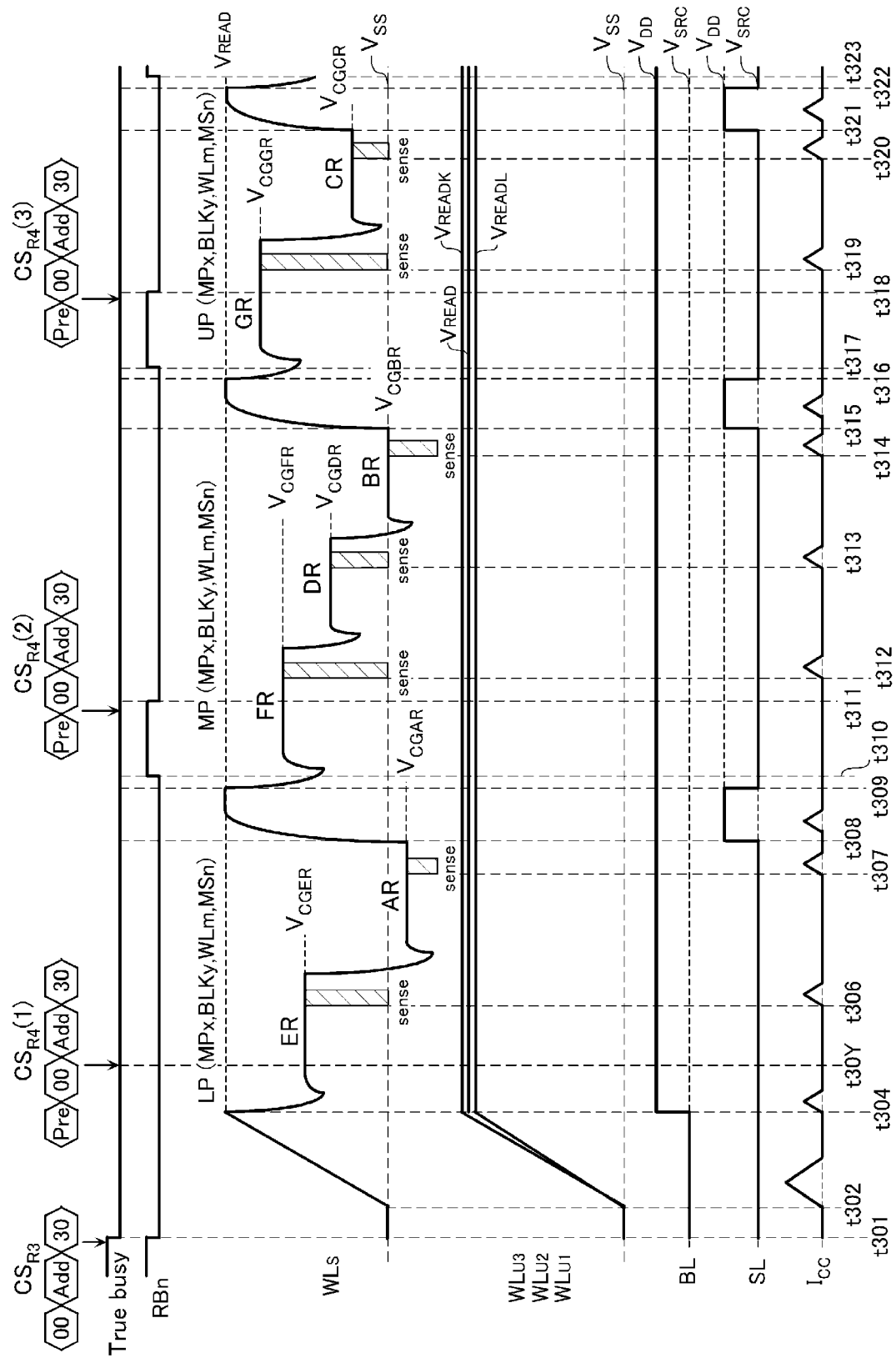
FIG. 30 is a timing chart illustrating a read operation of a connection read according to a sixth embodiment.

Next, a connection read after a normal read according to a sixth embodiment is described with reference to FIG. 30. FIG. 30 is a timing chart illustrating the connection read according to the sixth embodiment.

In the first embodiment (FIG. 24), the terminal RBn is controlled from "L" state to "H" state at timing t303, and the terminal RBn is controlled from "H" state to "L" state at timing t305. In contrast, in the sixth embodiment (FIG. 30), the terminal RBn is maintained in "L" state from timing t303 to timing t305.

In the first embodiment (FIG. 24), the memory die MD first inputs the command set $CS_{R1}$ instructing the cache read from the controller die CD, and then inputs the command set $CS_{R2}$ instructing the connection read from the controller die CD. In contrast, in the sixth embodiment (FIG. 30), a command set $CS_{R3}$ for instructing the normal read is input first from the controller die CD, and then a command set $CS_{R4}$ for instructing the connection read is input from the controller die CD.

A read operation corresponding to the command set $CS_{R3}$ may be referred to as a first read operation, and a read operation corresponding to the command set $CS_{R4}$ may be referred to as a second read operation. The command set $CS_{R3}$ includes data 00h, Add, and 30h as shown in FIG. 30. The command set $CS_{R4}$ includes data Pre(XXh), 00h, Add, and 30h as shown in FIG. 30.

As described above, the data Pre(XXh) means a special command indicating that the memory die MD can accept even during a busy period. The memory die MD recognizes the special command set by a prefix command (data XXh (Pre)) being added to the command set $CS_{R4}$ and inputs and accepts such a command set exceptionally even during the busy period.

However, when the terminal RBn (ready/busy signal RB) is in "L" state (busy state), the memory die MD does not execute an operation based on a command set even when the command set to which the prefix command (data XXh(Pre)) is not added is input.

A period during which a command set $CS_{R4}(1)$ can be input is a period up to a timing for ending the first read voltage supply operation (i.e., a timing at which a channel clean period is started: t308). Even if the command set $CS_{R4}(1)$ is input after the channel clean period is started, the connection read cannot be executed. In the example shown in FIG. 30, the command set $CS_{R4}(1)$ is input at timing t30Y.

In addition, the command sets $CS_{R4}(2)$ and $CS_{R4}(3)$ in FIG. 30 are input at the same timing as the command sets $CS_{R2}(2)$ and $CS_{R2}(3)$ in FIG. 24 and the like in the ready period. However, the command sets $CS_{R4}(2)$ and $CS_{R4}(3)$ in FIG. 30 may be input during the busy period. In such a case, the period during which the command sets $CS_{R4}(2)$ and $CS_{R4}(3)$ can be input is a period up to the timing at which the first read voltage supply operation ends (i.e., timing at which a channel clean period is started).

Even in such a configuration, the operating current $I_{CC}$ when charging the read path voltages $V_{READK}$, $V_{READL}$, and $V_{READ}$ to the word line WL (especially, non-selected word line $WL_U$) can be reduced, and the time required for the read operation of a plurality of pages can be shortened.

Other Embodiments

Above, the semiconductor memory device according to the first embodiment to the sixth embodiment is described. However, the semiconductor memory device described above is only an example, and the operation, configuration, and the like may be modified appropriately.

For example, in the semiconductor memory device according to the first to sixth embodiments, three bits of data is stored in each memory cell MC as described with reference to FIG. 16. However, the data stored in the memory cell MC may be one bit, two bits, or four bits or more.

Also, for example, in FIG. 24, the voltage $V_{DD}$ is supplied to the source line SL in the channel clean period (i.e., timing t308 to timing t309). However, a voltage $V_{SRC}$ may be supplied to the bit line BL in the channel clean period (i.e., timing t308 to timing t309). Even in such a constitution, the bit line BL and the source line SL can be made to have the same potential in the channel clean period.

Also, when the controller die CD cannot output the command set $CS_{R2}$ for instructing the connection read in a period during which the command set $CS_{R2}$ can be output, the controller die CD may output the command set $CS_{R1}$ for instructing the cache read.

Also, the command set $CS_{R2}$ for instructing the connection read can be input for any number of times. A second read operation corresponding to the command set $CS_{R2}$ can be continuously executed for any applicable number of times.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a memory string including a plurality of memory transistors connected in series;
a plurality of word lines connected to gates of the memory transistors, respectively; and
a control circuit configured to:
in response to a first command set, perform a first read operation; and
in response to a second command set received during the first read operation, perform a second read operation after the first read operation, wherein
during the first read operation, a voltage of a first selected one of the word lines with which data is to be read is decreased from a read pass voltage to a first read voltage and then increased to the read pass voltage,
during the second read operation, a voltage of a second selected one of the word lines with which data is to be read is set to a second read voltage and then increased to the read pass voltage, and
voltages of word lines that are neither selected during the first read operation nor the second read operation are maintained between the first read operation and the second read operation.

2. The semiconductor storage device according to claim 1, wherein the voltage of the first selected one of the word lines selected during the first read operation is maintained equal to or higher than a first voltage between the first read operation and the second read operation, the first voltage being one third of the read pass voltage.

3. The semiconductor storage device according to claim 1, wherein the first selected one of the word lines is same as the second selected one of the word lines.

4. The semiconductor storage device according to claim 3, wherein
the word lines that are neither selected during the first read operation nor the second read operation includes a first non-selected word line directly adjacent to the one of the word lines selected during the first and second read operations and a second non-selected word line that is not directly adjacent to the one of the word lines selected during the first and second read operations,
a voltage of the first non-selected word line is maintained at a first read pass voltage between the first read operation and the second read operation, and
a voltage of the second non-selected word line is maintained at a second read pass voltage lower than the first read pass voltage between the first read operation and the second read operation.

5. The semiconductor storage device according to claim 4, wherein the read pass voltage is same as one of the first read pass voltage and the second read pass voltage.

6. The semiconductor storage device according to claim 4, wherein the read pass voltage is different from the first read pass voltage and the second read pass voltage.

7. The semiconductor storage device according to claim 1, wherein the first selected one of the word lines is different from the second selected one of the word lines.

8. The semiconductor storage device according to claim 1, wherein
the first read voltage is lower than the second read voltage, and
a first time period to increase the voltage of the first selected one of the word lines from the first read voltage to the read pass voltage during the first read operation is greater than a second time period to increase the voltage of the second selected one of the word lines from the second read voltage to the read pass voltage during the second read operation.

9. The semiconductor storage device according to claim 1, wherein
the control circuit is further configured to, in response to a third command set received during the second read operation, perform a third read operation after the second operation,
during the third operation, a voltage of a third selected one of the word lines with which data is to be read is set to a third read voltage and then increased to the read pass voltage, and
voltages of word lines that are neither selected during the second read operation nor the third read operation are maintained between the second read operation and the third read operation.

10. The semiconductor storage device according to claim 9, wherein the voltage of the second selected one of the word lines is maintained at the read pass voltage between the second read operation and the third read operation.

11. The semiconductor storage device according to claim 1, wherein the control circuit is further configured to, in response to a third command set received after the second command set during the first read operation, perform a third read operation in accordance with the third command set without performing the second read operation.

12. The semiconductor storage device according to claim 1, wherein during the first read operation, the voltage of the first selected one of the word lines is decreased from the read pass voltage to a third read voltage and then further decreased to the first read voltage.

13. The semiconductor storage device according to claim 1, wherein during the first read operation, the voltage of the first selected one of the word lines is decreased from the read pass voltage to a third read voltage and then increased to the first read voltage, the first read voltage being lower than the read pass voltage.

14. The semiconductor storage device according to claim 1, wherein
the control circuit includes a terminal through which a ready/busy signal is transmitted, a ready state of the ready/busy signal enabling reception of the first and second command sets and a busy state of the ready/busy signal disabling reception of the first and second command sets, and
the control circuit is further configured to set the ready/busy signal to the ready state before the first read voltage is applied to the first selected one of the word lines during the first read operation.

15. The semiconductor storage device according to claim 14, wherein the control circuit is further configured to set the ready/busy signal to the busy state upon receiving the second command set during the first read operation.

16. The semiconductor storage device according to claim 1, wherein
the control circuit includes a terminal through which a ready/busy signal is transmitted, a ready state of the ready/busy signal enabling reception of the first and second command sets and a busy state of the ready/ busy signal disabling reception of the first command set, but enabling reception of the second command set, and the control circuit is further configured to maintain the ready/busy signal in the busy state during the first read operation.

17. The semiconductor storage device according to claim 1, further comprising:
a power supply terminal that receives an operation voltage of the semiconductor storage device, wherein
a first current, which is a maximum current that flows through the power supply terminal during the first read operation, is greater than a second current, which is a maximum current that flows through the power supply terminal during the second read operation.

18. A semiconductor storage device comprising:
a memory string including a plurality of memory transistors connected in series;
a power supply terminal that receives an operation voltage of the semiconductor storage device; and
a control circuit configured to:
in response to a first command set, perform a first read operation to read data from one of the memory transistors; and
in response to a second command set received during the first read operation, perform a second read operation to read data from one of the memory transistors after the first read operation,
wherein a first current, which is a maximum current that flows through the power supply terminal during the first read operation, is greater than a second current, which is a maximum current that flows through the power supply terminal during the second read operation.

19. The semiconductor storage device according to claim 18, wherein a first time period during which the first read operation is performed is greater than a second time period during which the second read operation is performed.

20. The semiconductor storage device according to claim 18, wherein
the control circuit is further configured to, in response to a third command set received during the second read operation, perform a third read operation after the second operation, and
a third current, which is a maximum current that flows through the power supply terminal during the third read operation, is less than the first current.

* * * * *